United States Patent
Bloom et al.

(10) Patent No.: US 10,522,778 B2
(45) Date of Patent: Dec. 31, 2019

(54) ORGANIC LIGHT-EMITTING DIODE INCLUDING AN ELECTRONIC TRANSPORT LAYER COMPRISING A THREE COMPONENT BLEND OF A MATRIX COMPOUND AND TWO LITHIUM COMPOUNDS

(71) Applicant: Novaled GmbH, Dresden (DE)

(72) Inventors: Francisco Bloom, Eindhoven (NL); Thomas Rosenow, Dresden (DE); Tobias Canzler, Dresden (DE); Bodo Wallikewitz, Dresden (DE)

(73) Assignee: Novaled GmbH, Dresden (DE)

( * ) Notice: Subject to any disclaimer, the term of this patent is extended or adjusted under 35 U.S.C. 154(b) by 288 days.

(21) Appl. No.: 15/516,067

(22) PCT Filed: Sep. 30, 2015

(86) PCT No.: PCT/EP2015/072630
§ 371 (c)(1),
(2) Date: Mar. 31, 2017

(87) PCT Pub. No.: WO2016/050882
PCT Pub. Date: Apr. 7, 2016

(65) Prior Publication Data
US 2017/0301876 A1 Oct. 19, 2017

(30) Foreign Application Priority Data
Oct. 1, 2014 (EP) .................................... 14187326

(51) Int. Cl.
*H01L 51/50* (2006.01)
*H01L 51/00* (2006.01)

(52) U.S. Cl.
CPC ...... *H01L 51/5072* (2013.01); *H01L 51/0077* (2013.01); *H01L 51/508* (2013.01); *H01L 51/5056* (2013.01); *H01L 51/5076* (2013.01); *H01L 51/0072* (2013.01)

(58) Field of Classification Search
None
See application file for complete search history.

(56) References Cited

U.S. PATENT DOCUMENTS

| | | | |
|---|---|---|---|
| 2009/0142618 A1 | 6/2009 | Begley et al. | |
| 2011/0215308 A1* | 9/2011 | Im | H01L 51/006 257/40 |
| 2013/0228753 A1 | 9/2013 | Moon et al. | |
| 2014/0014927 A1 | 1/2014 | Kim et al. | |

FOREIGN PATENT DOCUMENTS

| WO | 2013/079676 A1 | 6/2013 |
|---|---|---|
| WO | 2013079678 A1 | 6/2013 |

OTHER PUBLICATIONS

PCT International Search Report and Written Opinion for PCT Application No. PCT/EP2015/072630 dated Jan. 12, 2016 (11 pages).

* cited by examiner

*Primary Examiner* — Gregory D Clark
(74) *Attorney, Agent, or Firm* — Eversheds Sutherland (US) LLP

(57) ABSTRACT

The present invention relates to an organic light-emitting diode (100) comprising an emission layer (150) and at least one electron transport layer (161), wherein the at least one electron transport layer (161) comprises at least one matrix compound and at least two lithium compounds.

25 Claims, 3 Drawing Sheets

ORGANIC LIGHT-EMITTING DIODE INCLUDING AN ELECTRONIC TRANSPORT LAYER COMPRISING A THREE COMPONENT BLEND OF A MATRIX COMPOUND AND TWO LITHIUM COMPOUNDS

CROSS REFERENCE TO RELATED APPLICATIONS

This application is a U.S. national stage application of PCT/EP2015/072630, filed Sep. 30, 2015, which claims priority to European Application No. 14187326.5, filed Oct. 1, 2014. The contents of these applications are hereby incorporated by reference.

DESCRIPTION

The present invention relates to an organic light-emitting diode containing an electron transport layer comprising a three-component blend of a matrix compound and two lithium compounds, and a method of manufacturing the same.

DESCRIPTION OF THE RELATED

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

SUMMARY

It is one object to provide organic light-emitting diode having an increased external quantum efficiency (EQE), especially for blue emitting OLEDs but also, for example, for red, green or white emitting OLEDs, and/or an increased lifetime, in particular for top and/or bottom emission organic light-emitting diodes (OLED).

According to one aspect, there is provided an organic light-emitting diode (OLED) comprising an emission layer and at least one electron transport layer, wherein the at least one electron transport layer comprises at least one matrix compound and at least two lithium compounds.

According to one aspect, there is provided an organic light-emitting diode (OLED) comprising an emission layer and one electron transport layer, wherein the electron transport layer comprises one matrix compound and two lithium compounds.

According to various aspects of the present invention the organic light-emitting diode (OLED) may contain more than one electron transport layer, for example two or three electron transport layers. More than one electron transport layer is referred to as electron transport layer stack in the specification and claims.

According to various aspects the organic light-emitting diode (OLED) may comprises one or two electron transport layers.

According to various aspects the lithium compound can be a lithium organic complex. According to various aspects of the present invention an electron transport layer stack may contain at least one electron transport layer comprising at least one matrix compound and at least two lithium compounds.

According to various aspects the at least two lithium compounds can be lithium organic complexes.

According to various aspects of the present invention an electron transport layer stack may contain two electron transport layer, wherein two electron transport layers or preferably one electron transport layer, comprising one matrix compound and two lithium compounds.

According to various aspects of the OLED the electron transport layer stack of two electron transport layers may contain a first electron transport layer comprising a matrix compound and at least two lithium compounds and the second electron transport layer comprising one matrix compound only.

According to various aspects of the OLED the electron transport layer stack of two electron transport layers may contain a first electron transport layer comprising a matrix compound and at least two lithium compounds and the second electron transport layer comprising one matrix compound and one lithium compound.

According to various aspects of the OLED the electron transport layer stack of two electron transport layers may contain a first electron transport layer comprising a matrix compound and at least two lithium compounds and the second ETL comprising a matrix compound and an elemental metal, wherein the elemental metal is selected from a group comprising alkali, alkaline earth and/or rare earth metals.

According to various aspects of the OLED the electron transport layer stack of two electron transport layers may contain a first electron transport layer comprising a matrix compound and at least two lithium compounds and the second electron transport layer does not comprise a matrix compound and at least two lithium compounds.

According to various aspects of the OLED the electron transport layer stack of two electron transport layers may contain a first electron transport layer comprising a matrix compound and at least two lithium compounds and a second electron transport layer comprising a matrix compound and at least two lithium compounds.

According to various aspects of the OLED the electron transport layer stack of two electron transport layers may contain a first electron transport layer comprising a matrix compound and at least two lithium compounds and a second electron transport layer comprising a matrix compound and at least two lithium compounds, wherein the matrix compound of the first electron transport layer is same or different from the second electron transport layer.

According to various aspects of the OLED the electron transport layer stack of two electron transport layers may contain a first electron transport layer comprising a matrix compound and at least two lithium compounds and a second electron transport layer comprising a matrix compound and at least two lithium compounds, wherein at least one lithium compound, preferably two lithium compounds, of the first electron transport layer is same or different from the second electron transport layer.

According to various aspects of the OLED the electron transport layer stack of two electron transport layers may contain a first electron transport layer comprising a matrix compound and at least two lithium compounds and a second electron transport layer comprising a matrix compound and at least two lithium compounds, wherein at least the matrix compound and at least one lithium compound, preferably two lithium compounds, of the first electron transport layer is same or different from the second electron transport layer.

According to various aspects of the OLED the electron transport layer stack may be formed of three or more electron transport layers, containing at least one electron transport layer comprising a matrix compound and at least two lithium compounds.

According to various aspects the OLED comprises at least one electron transport layer or at least one layer of an electron transport layer stack comprising:
   at least one matrix compound and at least two lithium compounds selected from the group comprising lithium organic complexes; and/or
   at least one matrix compound and at least two lithium compounds, wherein at least a first lithium compound is selected from the group comprising lithium organic complexes and at least a second lithium compound is selected from the group comprising lithium halides.

According to various aspects of the OLED the electron transport layer stack may be formed of three or more electron transport layers, containing at least two electron transport layers comprising a matrix compound and at least two lithium compounds, wherein the matrix compound and/or at least one lithium compound or two lithium compounds of each electron transport layer containing the three component blend are same or different.

In the context of the present specification "triple mix" means a combination of a matrix compound and two lithium compounds.

According to various aspects of the OLED the electron transport layer and/or electron transport layer stack is free of elemental metal.

According to various aspects of the OLED the electron transport layer stack may contain at least one electron transport layer that is free of a lithium compound selected from the group lithium halide and/or lithium organic complex.

According to various aspects of the OLED the electron transport layer stack may contain at least one electron transport layer that is free of a metal salt and/or a metal organic complex.

In the context that the electron transport layer or layers are free of a metal salt, lithium halide and/or a metal organic complex, the term "free of" means that the so called "free off" electron transport layer or layers may comprise of about 5 wt.-% or less of a metal salt, lithium halide and/or a lithium organic complex, preferably about 0.5 wt.-% or less, and more preferably about 0.05 wt.-% or less, and even more preferably about 0.005 wt.-% or less of metal salt, lithium halide and/or lithium organic complex and most preferred no metal salt, lithium halide and/or a lithium organic complex.

According to various aspects, there is provided an organic light-emitting diode, whereby the organic light-emitting diode does not contain a charge generation layer (CGL).

According to various aspects the matrix compound can be selected from the group comprising:
   an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine;
   a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide; or
   a substituted phenanthroline compound, preferably 2,4,7,9-tetraphenyl-1,10-phenanthroline or 2,9-di(biphenyl-4-yl)-4,7-diphenyl-1,10-phenanthroline, According to various aspects the lithium halide is selected from the group comprising LiF, LiCl, LiBr or LiI, and preferable LiF.

According to various aspects, wherein for an OLED comprising one electron transport layer only the OLED may contains at least one electron injection layer.

According to various aspects, wherein for an electron transport layer stack of at least two electron transport layers the first electron transport layer is arranged closest to an emission layer and the second electron transport layer is arranged closest to a cathode.

According to various aspects, wherein for an electron transport layer stack of three electron transport layers the first electron transport layer is arranged closest to an emission layer, the second electron layer is sandwiched between the first and the third electron transport layer and the third electron transport layer is arranged closest to a cathode.

The organic light-emitting diode can be a bottom emission OLED or a top emission OLED.

For the following defined terms, these definitions shall be applied, unless a different definition is given in the claims or elsewhere in this specification.

The external quantum efficiency, also named EQE, is measured in percent (%).

The lifetime, also named LT, between starting brightness and 97% of the original brightness is measured in hours (h).

The voltage, also named V, is measured in Volt (V) at 10 milliAmpere per square centimeter ($mA/cm^2$) in bottom emission devices and at 15 $mA/cm^2$ for top emission devices.

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED" and "organic light-emitting diode" is simultaneously used and having the same meaning.

The term "lithium borate" as used in the specification includes a lithium organic borate complex.

The term "lithium compound" as used in the specification includes a lithium organic complex.

The term "lithium phenolate" as used in the specification includes a lithium phosphoryl aryl complex.

As used herein, ... weight percent", ... wt.-%", ... percent by weight", ... % by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer are selected such that it does not exceed 100 wt.-%.

All numeric values are herein assumed to be modified by the term "about", whether or not explicitly indicated. As used herein, the term "about" refers to variation in the numerical quantity that can occur. Whether or not modified by the term "about", the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

The term "alkyl" refers to straight-chain or branched alkyl groups. The term "1 to 20 carbon atoms" as used herein refers to straight-chain or branched alkyl groups having 1 to 20 carbon atoms. The alkyl groups can be selected from the group comprising methyl, ethyl and the isomers of propyl, butyl or pentyl, such as isopropyl, isobutyl, tert.-butyl, sec.-butyl and/or isopentyl. The term "aryl" refers to aromatic groups for example phenyl or naphthyl.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

According to various embodiments of the OLED the electron transport layer and/or electron transport layer stack may comprise as a lithium compound a lithium organic complex only.

According to various embodiments of the OLED the electron transport layer and/or electron transport layer stack may comprise at least two lithium compounds, preferably two lithium compounds, selected from the group comprising a lithium quinolate, a lithium borate, a lithium phenolate, preferably the lithium phenolate is a lithium phosphoryl aryl complex, a lithium pyridinolate or a lithium Schiff base and lithium fluorid, preferably a lithium 2-(diphenylphosphoryl)-phenolate, lithium tetra(1H-pyrazol-1-yl)borate, a lithium quinolate of formula (III), a lithium 2-(pyridin-2-yl) phenolate and LiF, and more preferred selected from the group comprising a lithium 2-(diphenylphosphoryl)-phenolate, lithium tetra(1H-pyrazol-1-yl)borate, a lithium quinolate of formula (III), a lithium 2-(pyridin-2-yl)phenolate.

According to various embodiments of the organic light-emitting diode at least one electron transport layer or at least two electron transport layers comprising:
about≤90 wt.-% to about≥30 wt.-%, preferably about≤80 wt.-% to about≥35 wt.-% and also preferred about≤70 wt.-% to about≥45 wt.-% and also preferred about≤65 wt.-% to about≥50 wt.-% of at least one matrix compound, preferably an anthracene based compound or a heteroaryl substituted anthracene based compound, a phosphine oxide based compound, a substituted phenanthroline compound; and
about≥10 wt.-% to about≤70 wt.-%, preferably about≥20 wt.-% to about≤65 wt.-% and also preferred about≥30 wt.-% to about≤55 wt.-% and also preferred about≥35 wt.-% to about≤50 wt.-% of at least two lithium compounds, preferably two lithium organic complexes or a lithium organic complex and a lithium halide, wherein the lithium halide is preferably a lithium fluoride; wherein the weight percent is based on the total weight of the corresponding electron transport layer.

According to various embodiments of the organic light-emitting diode at least one electron transport layer or at least two electron transport layers comprising:
about≤90 wt.-% to about≥30 wt.-%, preferably about≤80 wt.-% to about≥35 wt.-% and also preferred about≤70 wt.-% to about≥45 wt.-% and also preferred about≤65 wt.-% to about≥50 wt.-% of at least one matrix compound, preferably a phosphine oxide based compound, and more preferred a (3-(dibenzo[c,h]acridin-7-yl)phenyl)diphenyl-phosphine oxide; and
about≥10 wt.-% to about≤70 wt.-%, preferably about≥20 wt.-% to about≤65 wt.-% and also preferred about≥30 wt.-% to about≤55 wt.-% and also preferred about≥35 wt.-% to about≤50 wt.-% of at least two lithium compounds, preferably two lithium organic complexes, more preferred of two lithium organic complexes selected from the group comprising a lithium quinolate, a lithium borate, a lithium phenolate, preferably the lithium phenolate is a lithium phosphoryl aryl complex, a lithium pyridinolate or a lithium Schiff base, and most preferred of two lithium organic complexes selected from the group comprising a lithium 2-(diphenylphosphoryl)-phenolate, lithium tetra(1H-pyrazol-1-yl)borate, a lithium quinolate of formula (III) and lithium 2-(pyridin-2-yl)phenolate; wherein the weight percent is based on the total weight of the corresponding electron transport layer.

Lithium Organic Complex

According to various aspects at least one electron transport layer or at least two electron transport layers comprising at least two lithium compounds of lithium organic complexes, selected from the group comprising:
a lithium quinolate, a lithium borate, a lithium phenolate, preferably the lithium phenolate is a lithium phosphoryl aryl complex, a lithium pyridinolate or a lithium Schiff base; or
at least one lithium borate or at least one pyridinolate, and in addition a lithium organic complex selected from the group comprising a lithium quinolate, a lithium borate, a lithium phenolate, preferably the lithium phenolate is a lithium phosphoryl aryl complex, a lithium pyridinolate or a lithium Schiff base; preferably
the lithium quinolate has the formula I, II or III:

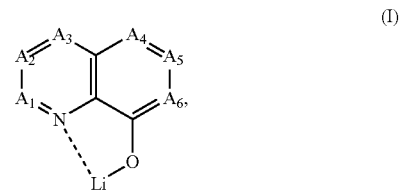

(I)

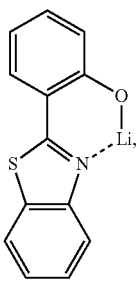

(II)

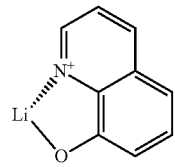

(III)

wherein
- $A_1$ to $A_6$ are same or independently selected from CH, CR, N, O;
- R is same or independently selected from hydrogen, halogen, alkyl or aryl or heteroaryl with 1 to 20 carbon atoms; and more preferred $A_1$ to $A_6$ are CH;
- preferably the lithium borate is a lithium tetra(1H-pyrazol-1-yl)borate;
- preferably the lithium phenolate is a lithium 2-(pyridin-2-yl)phenolate, a lithium 2-(diphenylphosphoryl)phenolate, a lithium imidazol phenolates, or a lithium 2-(pyridin-2-yl)phenolate and more preferred a lithium 2-(1-phenyl-1H-benzo[d]imidazol-2-yl)phenolate;
- preferably the a lithium pyridinolate is a lithium 2-(diphenylphosphoryl)pyridin-3-olate,
- preferably the lithium Schiff base has the structure 100, 101, 102 or 103:

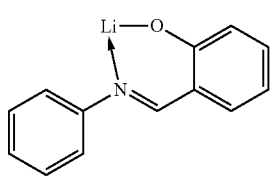

100

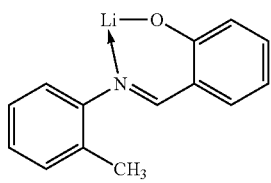

101

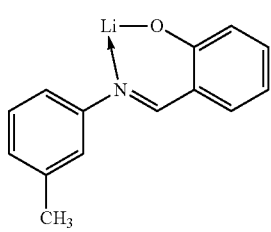

102

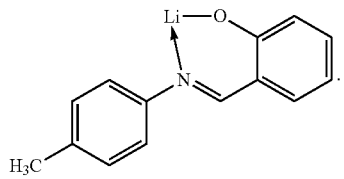

103

Quinolates that can be suitable used are disclosed in WO 2013079217 A1 and incorporated by reference.

According to various embodiments of the organic light-emitting diode (OLED) of the present invention the organic ligand of the lithium organic complex can be a borate based organic ligand.

Preferably, the lithium compound can be a lithium organic borate complex, also referred as lithium borate, which is a compound of formula IV:

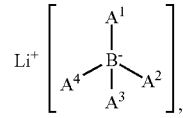

Formula IV wherein each of $A^1$, $A^2$, $A^3$ and/or $A^4$ is independently selected from the group comprising substituted or unsubstituted $C_6$-$C_{20}$ aryl and substituted or unsubstituted $C_2$-$C_{20}$ heteroaryl, wherein $A^1$, $A^2$, $A^3$ and/or $A^4$ of Formula IV are not a phenolate group.

According to one embodiment wherein the substituted or unsubstituted aryl is a $C_6$-$C_{18}$, preferably $C_6$-$C_{10}$.

According to one embodiment wherein the substituted or unsubstituted heteroaryl is a $C_3$-$C_{18}$, preferably $C_3$-$C_{10}$, and more preferred a $C_3$-$C_6$ heteroaryl.

Preferably the lithium organic borate complex is a lithium tetra(1H-pyrazol-1-yl)borate.

According to various embodiments of the organic light-emitting diode (OLED) of the present invention the organic ligand of the lithium organic complex can be a phenolate ligand.

According to various embodiments of the organic light-emitting diode (OLED) of the present invention the organic ligand of the lithium organic complex can be a phosphoryl phenolate ligand.

According to one embodiment the lithium compound can be a lithium organic complex which can be a phosphoryl aryl compound of formula V:

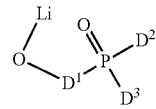

Formula V wherein $D^1$ is a $C_6$-$C_{20}$ arylene and each of $D^2$ to $D^3$ is independently selected from a $C_6$-$C_{20}$ aryl, wherein the aryl arylene may be unsubstituted or substituted.

According to one embodiment the lithium organic complex can be a phosphoryl aryl compound of formula V, wherein $D^1$, $D^2$ and $D^3$ are independently selected from $C_1$-$C_{30}$-alkyl, $C_3$-$C_{30}$-cycloalkyl, $C_2$-$C_{30}$-heteroalkyl, $C_6$-$C_{30}$-aryl, $C_2$-$C_{30}$-heteroaryl, $C_1$-$C_{30}$-alkoxy, $C_3$-$C_{30}$-cycloalkyloxy, $C_6$-$C_{30}$-aryloxy.

Preferably the lithium organic complex is a lithium 2-(diphenylphosphoryl)phenolate.

According to various embodiments of the organic light-emitting diode (OLED) of the present invention the organic ligand of the lithium organic complex can be a phosphoryl aryl ligand, namely a phosphoryl heteroaryloate ligand.

According to another embodiment, the lithium organic phosphoryl complex of formula V can be a lithium organic phosphoryl heteroaryl complex:

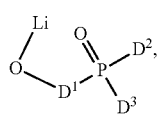

Formula V wherein
- $D^1$ is a $C_6$-$C_{30}$ arylene or $C_2$-$C_{30}$ heteroarylene comprising at least one atom selected from O, S and N in an aromatic ring; and
- each of $D^2$ and $D^3$ is independently selected from a $C_6$-$C_{30}$ aryl and $C_2$-$C_{30}$ heteroaryl comprising at least one atom selected from O, S and N in an aromatic ring and wherein either
  i) $D^1$ is $C_2$-$C_{30}$ heteroarylene comprising at least one atom selected from O, S and N in an aromatic ring, and/or
  ii) at least one of $D^2$ and $D^3$ is a $C_2$-$C_{30}$ heteroaryl comprising at least one atom selected from O, S and N in an aromatic ring.

In a further preferred embodiment, $D^1$, $D^2$ and/or $D^3$ are independently selected from
$C_1$-$C_{12}$-alkyl, $C_3$-$C_8$-cycloalkyl, $C_2$-$C_{12}$-heteroalkyl, $C_6$-$C_{18}$-aryl, $C_2$-$C_{18}$-heteroaryl, $C_1$-$C_{12}$-alkoxy, $C_3$-$C_8$-cycloalkyloxy, $C_6$-$C_{18}$-aryloxy.

Further, phenolate ligands may be selected from the group comprising pyridinolate, preferably 2-(diphenylphosphoryl)pyridin-3-olate. Pyridine phenolate ligands that can be suitable used are disclosed in JP 2008195623 and incorporated by reference.

In addition, phenolate ligands can be selected from the group comprising imidazol phenolates, preferably 2-(1-phenyl-1H-benzo[d]imidazol-2-yl)phenolate. Imidazol phenolate ligands that can be suitable used are disclosed in JP 2001291593 and incorporated by reference.

Also, phenolate ligands can be selected from the group comprising oxazol phenolates, preferably 2-(benzo[d]oxazol-2-yl)phenolate. Oxazol phenolate ligands that can be suitable used are disclosed in US 20030165711 and incorporated by reference.

According to one embodiment of the OLED, wherein at least one electron transport layer comprises:
- at least one lithium compound selected from the group comprising a lithium organic borate complex or a lithium phosphoryl aryl complex; and/or
- at least two lithium compounds selected from the group comprising a lithium organic borate complex and/or a lithium phosphoryl aryl complex.

According to another embodiment of the OLED, wherein at least one electron transport layer comprises at least one lithium compound of a lithium organic complex of:

a lithium organic borate complex of Formula IV:

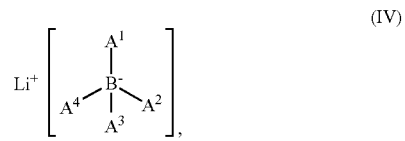

wherein each of $A^1$, $A^2$, $A^3$ and/or $A^4$ is independently selected from H, substituted or unsubstituted $C_6$-$C_{20}$ aryl and substituted or unsubstituted $C_2$-$C_{20}$ heteroaryl, preferably at least one $A^1$, $A^2$, $A^3$ and/or $A^4$ is a phenolate, and more preferred the lithium organic borate complex is a lithium tetra(1H-pyrazol-1-yl)borate; and/or a lithium phosphoryl aryl complex of Formula V:

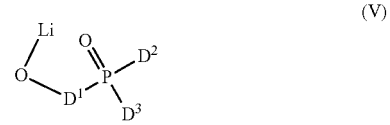

wherein $D^1$ is a unsubstituted or substituted $C_6$-$C_{20}$ arylene and each of $D^2$ to $D^3$ is independently selected from a unsubstituted or substituted $C_6$-$C_{20}$ aryl, and more preferred the lithium phosphoryl aryl complex is a lithium 2-(diphenylphosphoryl)phenolate; and/or wherein $D^1$ is a $C_6$-$C_{30}$ arylene or $C_2$-$C_{30}$ heteroarylene comprising at least one atom selected from O, S and N in an aromatic ring; and each of $D^2$ and $D^3$ is independently selected from a $C_6$-$C_{30}$ aryl and $C_2$-$C_{30}$ heteroaryl comprising at least one atom selected from O, S and N in an aromatic ring and wherein either
  i) $D^1$ is $C_2$-$C_{30}$ heteroarylene comprising at least one atom selected from O, S and N in an aromatic ring, and/or
  ii) at least one of $D^2$ and $D^3$ is a $C_2$-$C_{30}$ heteroaryl comprising at least one atom selected from O, S and N in an aromatic ring.

According to a further preferred embodiment of a lithium phosphoryl aryl complex of Formula V, $D^1$ is $C_6$-$C_{12}$ arylene or $C_2$-$C_{12}$ heteroarylene.

According to a further preferred embodiment of a lithium phosphoryl aryl complex of Formula V, each of $D^2$ and $D^3$ are independently selected from a $C_6$-$C_{10}$ aryl or $C_2$-$C_{12}$ heteroaryl; or preferably each of $D^2$ and $D^3$ are independently selected from phenyl and pyridyl.

Preferably the lithium organic complex is a lithium 2-(diphenylphosphoryl)pyridin-3-olate.

According to various embodiments of the organic light-emitting diode (OLED) of the present invention the organic ligand of the lithium organic complex can be selected from a borate ligand and a phosphoryl aryl ligand and a heteroaryl ligand. Preferably, the organic ligand of the lithium organic complex is selected from a borate ligand and a phosphoryl aryl ligand. Further, Lithium Schiff base organic complexes can be use. Lithium Schiff base organic complexes that can be suitable used having the structure 100, 101, 102 or 103:

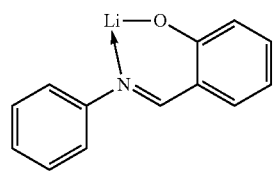

100

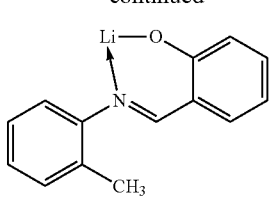

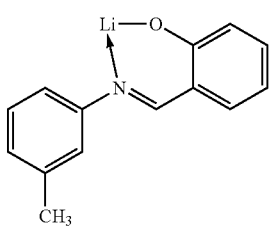

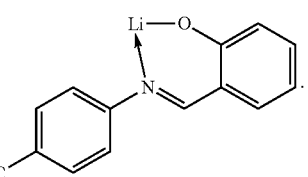

Suitable organic ligands to form a lithium organic complex that can be used for the first electron transport layer and/or the second electron transport layer are disclosed, and incorporated by reference, for example in US 2014/0048792 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

According to another embodiment of the OLED, wherein at least one electron transport layer comprises:

at least one lithium organic complex selected from a lithium borate complex or a lithium phosphoryl aryl complex, preferably a lithium organic borate complex of Formula IV or a lithium phosphoryl aryl complex of Formula V; and at least one lithium organic complex selected from a lithium quinolate, a lithium pyridinolate or a lithium Schiff base, preferably a lithium quinolate having the formula I, II or III and more preferred having the formula III.

According to another embodiment of the OLED, wherein at least one electron transport layer comprises:

at least one lithium organic complex selected from a lithium borate complex or a lithium phosphoryl aryl complex, preferably a lithium organic borate complex of Formula IV or a lithium phosphoryl aryl complex of Formula V; and at least one lithium compound that is a lithium halide selected from the group comprising LiF, LiCl, LiBr or LiJ, and preferably LiF.

According to another embodiment of the OLED comprising at least one or two electron transport layers, wherein at least one electron transport layer comprises:

at least one lithium organic complex that is selected from:
a lithium organic borate complex of Formula IV:

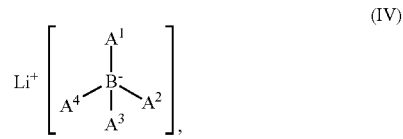

wherein each of $A^1$, $A^2$, $A^3$ and $A^4$ is independently selected from substituted or unsubstituted $C_6$-$C_{20}$ aryl and substituted or unsubstituted $C_2$-$C_{20}$ heteroaryl, wherein $A^1$, $A^2$, $A^3$ and/or $A^4$ of Formula (IV) are not a phenolate group; and more preferred the lithium organic borate complex is a lithium tetra(1H-pyrazol-1-yl)borate; and/or a lithium phosphoryl aryl complex of Formula V:

wherein $D^1$ is a unsubstituted or substituted $C_6$-$C_{20}$ arylene and each of $D^2$ to $D^3$ is independently selected from a unsubstituted or substituted $C_6$-$C_{20}$ aryl, preferably at least one $D^1$, $D^2$ and/or $D^3$ is a phenolate, and more preferred the lithium phosphoryl aryl complex is a lithium 2-(diphenylphosphoryl)phenolate; and/or wherein $D^1$ is a $C_6$-$C_{30}$ arylene or $C_2$-$C_{30}$ heteroarylene comprising at least one atom selected from O, S and N in an aromatic ring; and each of $D^2$ and $D^3$ is independently selected from a $C_6$-$C_{30}$ aryl and $C_2$-$C_{30}$ heteroaryl comprising at least one atom selected from O, S and N in an aromatic ring and wherein either i) $D^1$ is $C_2$-$C_{30}$ heteroarylene comprising at least one atom selected from O, S and N in an aromatic ring, and/or ii) at least one of $D^2$ and $D^3$ is a $C_2$-$C_{30}$ heteroaryl comprising at least one atom selected from O, S and N in an aromatic ring; and wherein the matrix compound of at least one or two electron transport layers is selected from the group comprising:

an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4'-diamine;

a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2- yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide; or a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises:

at least one lithium compound of a lithium organic complex that is selected from:

a lithium organic borate complex of Formula IV:

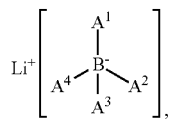

(IV)

wherein each of $A^1$, $A^2$, $A^3$ and $A^4$ is independently selected from substituted or unsubstituted $C_6$-$C_{20}$ aryl and substituted or unsubstituted $C_2$-$C_{20}$ heteroaryl, wherein $A^1$, $A^2$, $A^3$ and/or $A^4$ of Formula (IV) are not a phenolate group; and more preferred the lithium organic borate complex is a lithium tetra(1H-pyrazol-1-yl)borate; and/or a lithium phosphoryl aryl complex of Formula V:

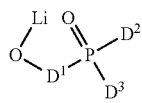

(V)

wherein $D^1$ is a unsubstituted or substituted $C_6$-$C_{20}$ arylene and each of $D^2$ to $D^3$ is independently selected from a unsubstituted or substituted $C_6$-$C_{20}$ aryl, preferably at least one $D^1$, $D^2$ and/or $D^3$ is a phenolate, and more preferred the lithium phosphoryl aryl complex is a lithium 2-(diphenylphosphoryl)phenolate; and/or wherein $D^1$ is a $C_6$-$C_{30}$ arylene or $C_2$-$C_{30}$ heteroarylene comprising at least one atom selected from O, S and N in an aromatic ring; and each of $D^2$ and $D^3$ is independently selected from a $C_6$-$C_{30}$ aryl and $C_2$-$C_{30}$ heteroaryl comprising at least one atom selected from O, S and N in an aromatic ring and wherein either i) $D^1$ is $C_2$-$C_{30}$ heteroarylene comprising at least one atom selected from O, S and N in an aromatic ring, and/or ii) at least one of $D^2$ and $D^3$ is a $C_2$-$C_{30}$ heteroaryl comprising at least one atom selected from O, S and N in an aromatic ring; and wherein the matrix compound of at least one or two electron transport layers is selected from the group comprising:

an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine.

According to another embodiment of the OLED comprising at least one or two electron transport layers, wherein at least one electron transport layer comprises:

at least one lithium compound can be lithium organic complex that is selected from:

a lithium organic borate complex of Formula IV:

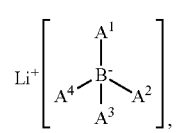

(IV)

wherein each of $A^1$, $A^2$, $A^3$ and $A^4$ is independently selected from substituted or unsubstituted $C_6$-$C_{20}$ aryl and substituted or unsubstituted $C_2$-$C_{20}$ heteroaryl, wherein $A^1$, $A^2$, $A^3$ and/or $A^4$ of Formula (IV) are not a phenolate group; and more preferred the lithium organic borate complex is a lithium tetra(1H-pyrazol-1-yl)borate; and/or a lithium phosphoryl aryl complex of Formula V:

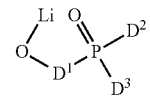

(V)

wherein $D^1$ is a unsubstituted or substituted $C_6$-$C_{20}$ arylene and each of $D^2$ to $D^3$ is independently selected from a unsubstituted or substituted $C_6$-$C_{20}$ aryl, preferably at least one $D^1$, $D^2$ and/or $D^3$ is a phenolate, and more preferred the lithium phosphoryl aryl complex is a lithium 2-(diphenylphosphoryl)phenolate; and/or wherein $D^1$ is a $C_6$-$C_{30}$ arylene or $C_2$-$C_{30}$ heteroarylene comprising at least one atom selected from O, S and N in an aromatic ring; and each of $D^2$ and $D^3$ is independently selected from a $C_6$-$C_{30}$ aryl and $C_2$-$C_{30}$ heteroaryl comprising at least one atom selected from O, S and N in an aromatic ring and wherein either i) $D^1$ is $C_2$-$C_{30}$ heteroarylene comprising at least one atom selected from O, S and N in an aromatic ring, and/or ii) at least one of $D^2$ and $D^3$ is a $C_2$-$C_{30}$ heteroaryl comprising at least one atom selected from O, S and N in an aromatic ring; and wherein the matrix compound of at least one or two electron transport layers is selected from the group comprising:

a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]

phosphepine-3-oxide, bis(4-(anthracen-9-yl)phenyl) (phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide.

According to another embodiment of the OLED comprising at least one or two electron transport layers, wherein at least one electron transport layer comprises:

at least one lithium compound of a lithium organic complex that is selected from:

a lithium organic borate complex of Formula IV:

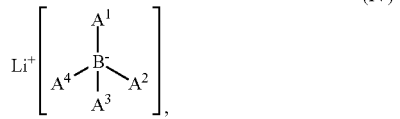

(IV)

wherein each of $A^1$, $A^2$, $A^3$ and $A^4$ is independently selected from substituted or unsubstituted $C_6$-$C_{20}$ aryl and substituted or unsubstituted $C_2$-$C_{20}$ heteroaryl, wherein $A^1$, $A^2$, $A^3$ and/or $A^4$ of Formula (IV) are not a phenolate group; and more preferred the lithium organic borate complex is a lithium tetra(1H-pyrazol-1-yl)borate; and/or a lithium phosphoryl aryl complex of Formula V:

(V)

wherein $D^1$ is a unsubstituted or substituted $C_6$-$C_{20}$ arylene and each of $D^2$ to $D^3$ is independently selected from a unsubstituted or substituted $C_6$-$C_{20}$ aryl, preferably at least one $D^1$, $D^2$ and/or $D^3$ is a phenolate, and more preferred the lithium phosphoryl aryl complex is a lithium 2-(diphenylphosphoryl)phenolate; and/or wherein $D^1$ is a $C_6$-$C_{30}$ arylene or $C_2$-$C_{30}$ heteroarylene comprising at least one atom selected from O, S and N in an aromatic ring; and each of $D^2$ and $D^3$ is independently selected from a $C_6$-$C_{30}$ aryl and $C_2$-$C_{30}$ heteroaryl comprising at least one atom selected from O, S and N in an aromatic ring and wherein either
  i) $D^1$ is $C_2$-$C_{30}$ heteroarylene comprising at least one atom selected from O, S and N in an aromatic ring, and/or
  ii) at least one of $D^2$ and $D^3$ is a $C_2$-$C_{30}$ heteroaryl comprising at least one atom selected from O, S and N in an aromatic ring; and wherein the matrix compound of at least one or two electron transport layers is selected from the group comprising:
  a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least one lithium organic complex that is selected from the group comprising a lithium organic borate complex or a lithium phosphoryl aryl complex; and wherein the matrix compound of at least one or two electron transport layers is selected from the group comprising:
  an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine;
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl) (phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide; or
  a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least two lithium organic complexes that are selected from the group comprising a lithium organic borate complex and a lithium phosphoryl aryl complex; and wherein the matrix compound of at least one or two electron transport layers is selected from the group comprising:
  an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine;
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl) (phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide; or
  a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least one lithium organic complex that is selected from the group comprising a lithium organic borate complex or a lithium phosphoryl aryl complex; and
wherein the matrix compound of at least one or two electron transport layers is selected from the group comprising:
  an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine.

According to another embodiment of the OLED comprising at least one or two electron transport layers, wherein at least one electron transport layer comprises at least two lithium organic complexes that are selected from the group comprising a lithium organic borate complex and a lithium phosphoryl aryl complex; and
wherein the matrix compound of at least one or two electron transport layers is selected from the group comprising:
  an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine.

According to another embodiment of the OLED comprising at least one or two electron transport layers, wherein at least one electron transport layer comprises at least one lithium organic complex that is selected from the group comprising a lithium organic borate complex or a lithium phosphoryl aryl complex; and
wherein the matrix compound of at least one or two electron transport layers is selected from the group comprising:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to another embodiment of the OLED comprising at least one or two electron transport layers, wherein at least one electron transport layer comprises at least two lithium organic complexes that are selected from the group comprising a lithium organic borate complex and a lithium phosphoryl aryl complex; and
wherein the matrix compound of at least one or two electron transport layers is selected from the group comprising:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

According to another embodiment of the OLED comprising at least one or two electron transport layers, wherein at least one electron transport layer comprises at least one lithium organic complex that is selected from the group comprising a lithium organic borate complex or a lithium phosphoryl aryl complex; and
wherein the matrix compound of at least one or two electron transport layers is selected from the group comprising:
  a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least two lithium organic complexes that are selected from the group comprising a lithium organic borate complex and a lithium phosphoryl aryl complex; and
wherein the matrix compound of at least one or two electron transport layers is selected from the group comprising:
  a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least one lithium organic complex that is selected from the group comprising a lithium tetra(1H-pyrazol-1-yl)borate, a lithium 2-(diphenyl-phosphoryl)phenolate, and/or a lithium 2-(diphenyl-phosphoryl)pyridin-3-olate; and
wherein the matrix compound of at least one or two electron transport layers is selected from the group comprising:
  an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine;
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; or
  a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least one lithium organic complex that is selected from the group comprising a lithium 8-hydroxyquinolate, lithium tetra(1H- pyrazol-1-yl)borate, lithium 2-(diphenyl-phosphoryl)phenolate, lithium 2-(pyridin-2-yl)phenolate, lithium 2-(1-phenyl-1H-benzo[d]imidazol-2-yl)phenolate, lithium 2-(benzo[d]oxazol-2-yl)phenolate, lithium 2-(diphenyl-phosphoryl)pyridin-3-olate; and wherein the matrix compound of at least one or two electron transport layers is selected from the group comprising:

an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4"-di(naphthalen-1-yl)-N4,N4"-diphenyl-[1,1':4',1"-terphenyl]-4,4"-diamine;

a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide; or a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED comprising at least one or two electron transport layers, wherein at least one electron transport layer comprises at least one lithium organic complex that is selected from the group comprising a lithium tetra(1H-pyrazol-1-yl)borate, a lithium 2-(diphenyl-phosphoryl)phenolate, and/or a lithium 2-(diphenyl-phosphoryl)pyridin-3-olate; and wherein the matrix compound of at least one or two electron transport layers is selected from the group comprising:

an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4"-di(naphthalen-1-yl)-N4,N4"-diphenyl-[1,1':4',1"-terphenyl]-4,4"-diamine;

a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl) diphenylphosphine oxide and/or phenyl bis(3-(pyren-1-yl)phenyl)phosphine oxide; or a substituted phenanthroline compound, preferably 2,4,7,9-tetraphenyl-1,10-phenanthroline or 2,9-di(biphenyl-4-yl)-4,7-diphenyl-1,10-phenanthroline.

According to another embodiment of the OLED, at least one electron transport layer may comprises a third lithium compound, wherein the third lithium compound can be a lithium quinolate or a lithium phenolate, preferably the lithium phenolate is a lithium phosphoryl aryl complex.

Suitable lithium organic complexes that can be most preferably used for the electron transport layer are mentioned in Table 1 below.

TABLE 1

| | Lithium organic complex that can be suitable used | | |
|---|---|---|---|
| Compound | Name | Structure | Reference |
| LiQ | lithium 8-hydroxyquinolate | 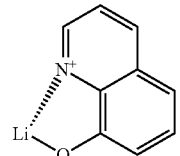 | WO 2013079217 A1 |
| Li-1 | lithium tetra(1H-pyrazol-1-yl)borate | 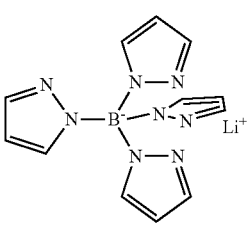 | WO 2013079676 A1 |

TABLE 1-continued

Lithium organic complex that can be suitable used

| Compound | Name | Structure | Reference |
|---|---|---|---|
| Li-2 | lithium 2-(diphenyl-phosphoryl)phenolate | | WO 2013079678A1 |
| Li-3 | lithium 2-(pyridin-2-yl)phenolate | | JP 2008195623 |
| Li-4 | lithium 2-(1-phenyl-1H-benzo[d]imidazol-2-yl)phenolate | | JP 2001291593 |
| Li-5 | lithium 2-(benzo[d]oxazol-2-yl)phenolate | | US 20030165711 |
| Li-6 | lithium 2-(diphenyl-phosphoryl)pyridin-3-olate | | EP 2811000 A1 |

Matrix compounds

According to various embodiments of the organic light-emitting diode (OLED) of the present invention the electron transport layer or the electron transport layers of an electron transport layer stack, may comprises at least one matrix compound each.

According to various embodiments of the organic light-emitting diode (OLED) of the present invention comprising an electron transport layer stack of at least two electron transport layers or at least three electron transport layers, wherein each electron transport layer comprises at least one matrix compound, whereby the matrix compound of the electron transport layers are selected same or different.

According to various embodiments of the organic light-emitting diode (OLED) the at least two electron transport layers (161/162) or the at least three electron transport layers (161/162/163) of an electron transport layer stack comprise at least one matrix compound, whereby the matrix compound of the electron transport layers are selected same or different, and wherein the matrix compound is selected from:

an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4"-di(naphthalen-1-yl)-N4,N4"-diphenyl-[1,1':4',1"-terphenyl]-4,4"-diamine;

a phosphine oxide based compound, preferably (3-(dibenzo[c,h]acridin-7-yl)phenyl)diphenylphosphine oxide, phenyl bis(3-(pyren-1-yl)phenyl)phosphine oxide 3-phenyl-3H-benzo[b]dinaphtho[2,1-d:1',2'-f]phosphepine-3-oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'- biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or bis(4-(anthracen-9yl)phenyl)(phenyl)phosphine oxide; or a substituted phenanthroline compound, preferably 2,4,7,9-tetraphenyl-1,10-phenanthroline or 2,9-di(biphenyl-4-yl)-4,7-diphenyl-1,10-phenanthroline.

Suitable matrix compounds that can be most preferably used for the electron transport layer are mentioned in Table 2 below.

TABLE 2

Chemical structures of matrix compounds that can be suitable used

| Compound | Name | Structure | Reference |
|---|---|---|---|
| MX 1 | 2-(4-(9,10-di(naphthalen-2-yl)anthracen-2-yl)phenyl)-1-phenyl-1H-benzo[d]imidazole | | U.S. Pat. No. 6,878,469 B2 |
| MX 2 | (3-(dibenzo[c,h]acridin-7-yl)phenyl)diphenylphosphine oxide | | EP 2395571B1, WO2013079217A1 |
| MX 3 | Phenylbis(3-(pyren-1-yl)phenyl)phosphine | | EP13187905.8 |

TABLE 2-continued

Chemical structures of matrix compounds that can be suitable used

| Compound | Name | Structure | Reference |
| --- | --- | --- | --- |
| MX 4 | 3-Phenyl-3H-benzo[b]dinaphtho[2,1-d:1',2'-f]phosphepine-3-oxide | | EP13199361.0 |
| MX 5 | Phenyldi(pyren-1-yl)phosphine oxide | | JP4876333 |
| MX 6 | 2,4,7,9-tetraphenyl-1,10-phenanthroline | | EP1786050 |
| MX 8 | 2,9-di(biphenyl-4-yl)-4,7-diphenyl-1,10-phenanthroline | | EP1786050 |

TABLE 2-continued

Chemical structures of matrix compounds that can be suitable used

| Compound | Name | Structure | Reference |
|---|---|---|---|
| MX 9 | bis(4-(anthracen-9-yl)phenyl)(phenyl) phosphine oxide | | EP13187905 |
| MX 10 | (3-(9,10-di(naphthalen-2-yl)anthracen-2-yl)phenyl) diphenylphosphine oxide | | WO2015052284A1 |
| MX 11 | 4,7-diphenyl-2,9-di-p-tolyl-1,10-phenanthroline | | EP1786050 |
| MX 12 | 9-(4-(naphthalen-1-yl)phenyl)-10-phenylanthracene | | US2015060785 |

According to various embodiments of the organic light-emitting diode (OLED) the thicknesses of an OLED with one electron transport layer or the thicknesses of at least a first electron transport layer (161) of an electron transport layer stack and/or the thicknesses of at least a second electron transport layer (162) of an electron transport layer stack, are the same or each independently, in the range of about≥0.5 nm to about≤95 nm, preferably of about≥3 nm to about≤80 nm, further preferred of about≥5 nm to about≤60 nm, also preferred of about≥6 nm to about≤40 nm, in addition preferred about≥8 nm to about≤20 nm and more preferred of about>10 nm to about≤18 nm.

According to various embodiments of the organic light-emitting diode (OLED) the thicknesses of the electron transport layer stack can be in the range of about≥25 nm to about≤100 nm, preferably of about≥30 nm to about≤80 nm, further preferred of about≥35 nm to about≤60 nm, and more preferred of about≥36 nm to about≤40 nm.

According to various embodiments of the organic light-emitting diode (OLED) of the present invention the electron transport layer stack has 2 to 4 electron transport layers and more preferred 2 to 3 electron transport layers.

According to various embodiments of the organic light-emitting diode (OLED) of the present invention the second electron transport layer can be arranged directly on the first electron transport layer and an optional third electron transport layer can be arranged directly on the second electron transport layer, so that the second electron transport layer is sandwiched between the first and third electron transport layers.

According to another aspect, there is provided an organic light-emitting diode comprising: a substrate; a first anode electrode arranged on the substrate; a second cathode electrode arranged on the first anode electrode; and one electron transport layer arranged between the first anode electrode and the second cathode electrode, comprising or consisting of at least two electron transport layers or at least three electron transport layers.

According to another aspect, there is provided an organic light-emitting diode comprising: a substrate; a first anode electrode arranged on the substrate; a second cathode electrode arranged on the first anode electrode; and an electron transport layer stack arranged between the first anode electrode and the second cathode electrode, comprising or consisting of at least two electron transport layers or at least three electron transport layers.

According to various embodiments, the organic light-emitting diode (OLED) may further include at least one layer selected from the group consisting of a hole injection layer, a hole transport layer, an emission layer, and a hole blocking layer, arranged between the first anode electrode and the electron transport layer.

According to another aspect, there is provided an organic light-emitting diode comprising in addition: at least one layer selected from the group consisting of a hole injection layer, a hole transport layer, an emission layer, and a hole blocking layer, arranged between the first anode electrode and the electron transport layer stack.

According to various aspects, there is provided an organic light-emitting diode further comprising an electron injection layer arranged between the electron transport layer and the second cathode electrode.

According to another aspect, there is provided an organic light-emitting diode comprising one electron transport layer and at least one electron injection layer; or a transport layer stack having two to four electron transport layers, preferably three electron transport layers and most preferred two electron transport layers, whereby at least one electron transport layer comprises a matrix compound and at least two lithium compounds.

According to another aspect the organic light-emitting diode comprising a transport layer stack can be free of an electron injection layer.

According to various embodiments of the OLED of the present invention, the OLED may not comprise an electron injection layer.

According to various embodiments of the OLED of the present invention, the OLED may not comprise a charge generation layer.

According to various embodiments of the OLED of the present invention, the OLED may not comprise an electron injection layer and a charge generation layer.

According to another aspect, there is provided a method of manufacturing an organic light-emitting diode (OLED), the method using:
  deposition via at least three deposition sources; or
  deposition via vacuum thermal evaporation; or
  deposition via solution processing, preferably the processing is selected from spin-coating, printing, casting and/or slot-die coating.

According to various aspects, there is provided a method using:
  a first deposition source to release the matrix compound, and
  a second deposition source to release a first lithium compound of lithium halide or lithium organic complex, preferably a first lithium organic complex, and
  a third deposition source to release a second lithium compound of lithium halide or lithium organic complex, preferably a second lithium organic complex; and
the method comprising the steps of forming the electron transport layer; whereby the electron transport layer is formed by releasing the matrix compound from at least one deposition source and a first lithium halide or lithium organic complex from a different deposition source and a second lithium halide or lithium organic complex, preferably lithium organic complex, from a different deposition source.

According to various aspects, there is provided a method using:
  a first or a first and a fourth deposition source to release the matrix compound, and
  a second deposition source to release a first lithium compound of lithium halide or lithium organic complex, preferably a first lithium organic complex, and
  a third deposition source to release a second lithium compound of lithium halide or lithium organic complex, preferably a second lithium organic complex; and
the method comprising the steps of forming the electron transport layer or the electron transport layer stack; whereby
  a first electron transport layer is formed by releasing the matrix compound from at least one deposition source (first deposition source) and a first lithium halide or lithium organic complex, from a different deposition source (second deposition source) and a second lithium halide or lithium organic complex, preferably lithium organic complex, from a different deposition source (third deposition source);
  optional onto the first electron transport layer a second electron transport layer is formed by releasing the matrix compound from at least one deposition source and optional the first and second lithium compound from different deposition source;

optional onto the second electron transport layer a third electron transport layer is formed by releasing the matrix compound from at least one deposition source and optional the first and second lithium compound from different deposition source;
preferably the second electron transport layer or the second and third electron transport layer can be free of a first and second lithium compound.

According to various aspects, the method may further include forming on the first anode electrode an emission layer and at least one layer selected from the group consisting of forming a hole injection layer, forming a hole transport layer, or forming a hole blocking layer, between the first anode electrode and the electron transport layer or electron transport layer stack.

According to various aspects, the method may further include the steps for forming an organic light-emitting diode (OLED), wherein
- on a substrate a first anode electrode is formed,
- on the first anode electrode an emission layer is formed,
- on the emission layer at least a first electron transport layer is formed, optional a second electron transport layer is formed directly on the first electron transport layer or optional in case of a third electron transport layer, the third electron transport layer is formed directly on the second electron transport layer,
- on the electron transport layer or the electron transport layer stack a second cathode electrode is formed,
- optional a hole injection layer, a hole transport layer, an emission layer, and a hole blocking layer, are formed between the at least first anode electrode and the electron transport layer or electron transport layer stack,
- optional an electron injection layer is formed between the electron transport layer or electron transport layer stack, and the at least second cathode electrode.

According to various aspects, the method may further include the steps for forming an organic light-emitting diode (OLED), wherein an electron injection layer is formed between the electron transport layer or electron transport layer stack, and the at least second cathode electrode.

According to various aspects, the method may further include the steps for forming an organic light-emitting diode (OLED), wherein an electron injection layer is formed between the one electron transport layer or electron transport layer stack, and the at least second cathode electrode.

According to various aspects, the method may further include the steps for forming an organic light-emitting diode (OLED), wherein
- on a substrate a first anode electrode is formed,
- on the first anode electrode an emission layer is formed,
- on the emission layer at least a first electron transport layer is formed, optional a second electron transport layer is formed directly on the first electron transport layer or optional in case of a third electron transport layer, the third electron transport layer is formed directly on the second electron transport layer,
- on the electron transport layer or the electron transport layer stack a second cathode electrode is formed,
- an electron injection layer is formed between the electron transport layer or electron transport layer stack, and the at least second cathode electrode
- optional a hole injection layer, a hole transport layer, an emission layer, and a hole blocking layer, are formed between the at least first anode electrode and the electron transport layer or electron transport layer stack.

However, according to various embodiments of the OLED of the present invention, the OLED may not comprise an electron injection layer and/or a charge generation layer.

Additional aspects and/or advantages of the invention will be set fourth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
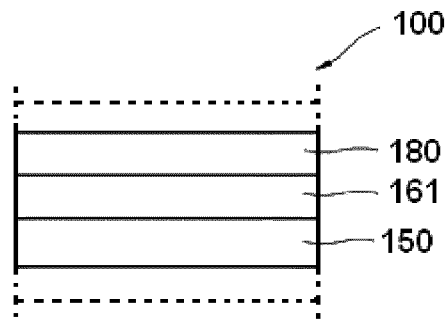
FIG. 1 is a schematic sectional view of an organic light-emitting diode (OLED), according to an exemplary embodiment of the present invention with an emission layer, one electron transport layer and an electron injection layer.

Reference will now be made in detail to the exemplary aspects, examples of which are illustrated in the accompanying drawings, wherein like reference numerals refer to the like elements throughout. The exemplary embodiments are described below, in order to explain the aspects, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode 100, according to an exemplary embodiment of the present invention. The OLED 100 includes an emission layer 150, an electron transport layer (ETL) 161 and an electron injection layer 180, whereby the electron transport layer 161 is disposed directly on the emission layer 150 and the electron injection layer 180 is disposed directly on the electron transport layer 161.

Figure 2:
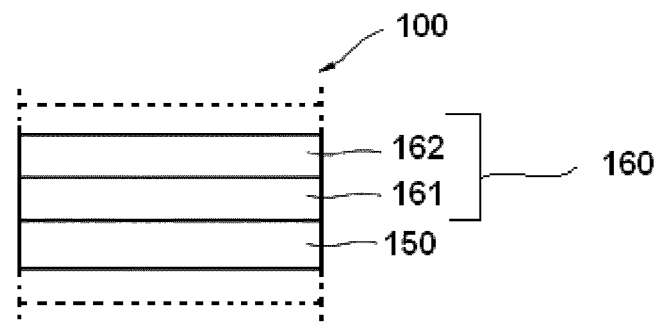
FIG. 2 is a schematic sectional view of an organic light-emitting diode (OLED), according to an exemplary embodiment of the present invention with an emission layer and two electron transport layers.

FIG. 2 is a schematic sectional view of an organic light-emitting diode 100, according to an exemplary embodiment of the present invention. The OLED 100 includes an emission layer 150 and an electron transport layer stack (ETL) 160 comprising a first electron transport layer 161 and a second electron transport layer 162, whereby the second electron transport layer 162 is disposed directly on the first electron transport layer 161.

Figure 3:
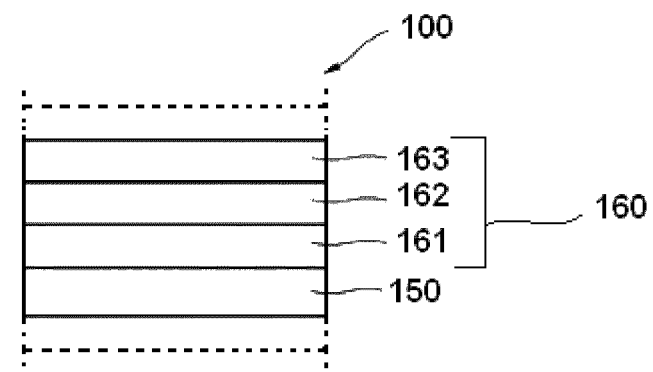
FIG. 3 is a schematic sectional view of an OLED, according to an exemplary embodiment of the present invention with an emission layer and three electron transport layers.

FIG. 3 is a schematic sectional view of an organic light-emitting diode 100, according to an exemplary embodiment of the present invention. The OLED 100 includes an emission layer 150 and an electron transport layer stack (ETL) 160 comprising a first electron transport layer 161, a second electron transport layer 162, and a third electron transport layer 163, whereby the second electron transport layer 162 is disposed directly on the first electron transport layer 161 and the third electron transport layer 163 is disposed directly on the first electron transport layer 162.

Figure 4:
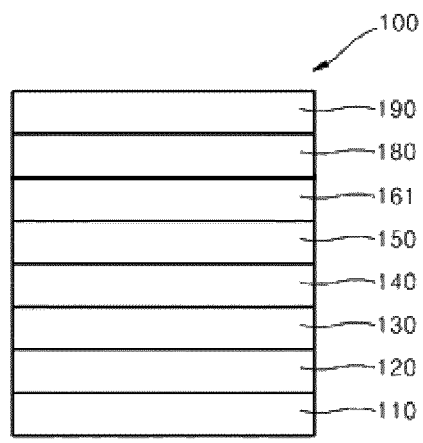
FIG. 4 is a schematic sectional view of an organic light-emitting diode (OLED), according to an exemplary embodiment of the present invention with an emission layer and one electron transport layer.

FIG. 4 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, one electron transport layer (ETL) 161, an electron injection layer (EIL) 180, and a second electrode 190. The electron transport layer (ETL) 161 includes a matrix compound and two lithium organic complexes. The electron transport layer (ETL) 161 is formed directly on the EML 150.

Figure 5:
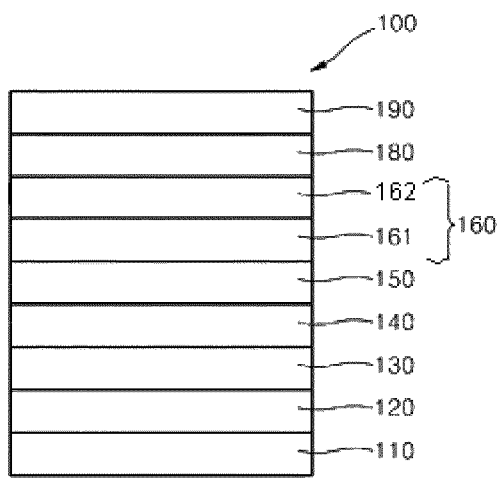
FIG. 5 is a schematic sectional view of an organic light-emitting diode (OLED), according to an exemplary embodiment of the present invention with an emission layer and two electron transport layers.

FIG. 5 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190. The electron transport layer (ETL) 160 includes a first electron transport layer 161 including a matrix compound, a lithium halide and a lithium organic complex and a second electron transport layer 162 including a matrix compound but is free of a lithium halide and a lithium organic complex. The second electron transport layer 162 is directly formed on the first electron transport layer 161. The first layer 161 may be formed directly on the EML 150.

Figure 6:
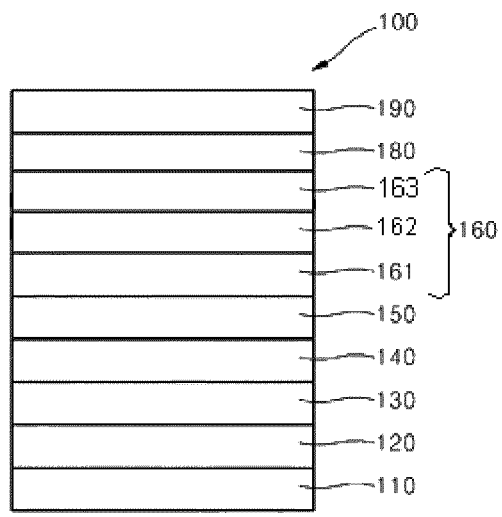
FIG. 6 is a schematic sectional view of an OLED, according to an exemplary embodiment of the present invention with an emission layer and three electron transport layers.

FIG. 6 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190. The electron transport layer (ETL) 160 includes a first electron transport layer 161 and a third electron transport layer 163 including a matrix compound and two different lithium organic complexes; and the second electron transport layer 162 includes a matrix compound which is free of a lithium halide and lithium organic complex. The second electron transport layer 162 is directly formed on the first electron transport layer 161 and the third electron layer 163 is directly formed on the second electron layer 162. The first layer 161 may be formed directly on the emission layer (EML) 150.

The substrate 110 may be any substrate that is commonly used in manufacturing of organic light-emitting diodes. If light is emitted through the substrate, the substrate 110 may be a transparent material, for example a glass substrate or a transparent plastic substrate, having excellent mechanical strength, thermal stability, transparency, surface smoothness, ease of handling, and waterproofness. If light is emitted through the top surface, the substrate 110 may be a transparent or non-transparent material, for example a glass substrate, a plastic substrate, a metal substrate or a silicon substrate.

The first anode electrode 120 may be formed by depositing or sputtering a compound that is used to form the first anode electrode 120. The compound used to form the first anode electrode 120 may be a high work-function compound, so as to facilitate hole injection. If a p-doped HIL is used, the anode material may also be selected from a low work function material (i.e. Aluminum).The first anode electrode 120 may be a transparent or reflective electrode. Transparent conductive compounds, such as indium tin oxide (ITO), indium zinc oxide (IZO), tin-dioxide ($SnO_2$), and zinc oxide (ZnO), may be used to form the first anode electrode 120. The first anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The HIL 130 may be formed on the first anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately -5.2 eV, doped with tetrafluoro-tetracyanoquinonedimethane (F4TCNQ), which LUMO level is about -5.2 eV; zinc phthalocyanine (ZnPc) (HOMO =-5.2 eV) doped with F4TCNQ; α-NPD (N,N'-Bis (naphthalen-1-yl)-N,N-bis(phenyl)-benzidine) doped with F4TCNQ. α-NPD doped with 2,2'-(perfluoronaphthalene-2, 6-diylidene) dimalononitrile (PD1). α-NPD doped with 2,2',2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

carbazolyl)triphenylamine (TCTA). Among these compounds, TCTA can transport holes and inhibit excitons from being diffused into the EML.

Compounds that can be preferably used are mentioned in Table 3.

TABLE 3

| IUPAC name | Structure | Reference |
|---|---|---|
| N4,N4"-di(naphthalen-1-yl)-N4,N4"-diphenyl-[1,1':4',1"-terphenyl]-4,4"-diamine | | DE102012101652 A1 |
| 2,2',2"-(cyclopropane-1,2,3-triylidene)tris(2-(p-cyanotetrafluorophenyl)acetonitrile) | | EP 1988587 A1, EP 2180029 A1 |

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalene-1-yl)-N,N'-diphenyl benzydine (alpha -NPD); and a triphenylamine-based compound, such as 4,4',4"-tris(N-

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

The EML 150 may be formed on the HTL 140 by vacuum deposition, spin coating, slot-die coating, printing, casting, LB, or the like. When the EML 150 is formed using vacuum deposition or spin coating, the conditions for deposition and coating may be similar to those for the formation of the HIL 130. However, the conditions for deposition and coating may vary, according to the compound that is used to form the EML 150.

The emission layer (EML) 150 may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ) 2), E3 below, ADN and referred to as Formula 1, Compound 1 below, and Compound 2 below.

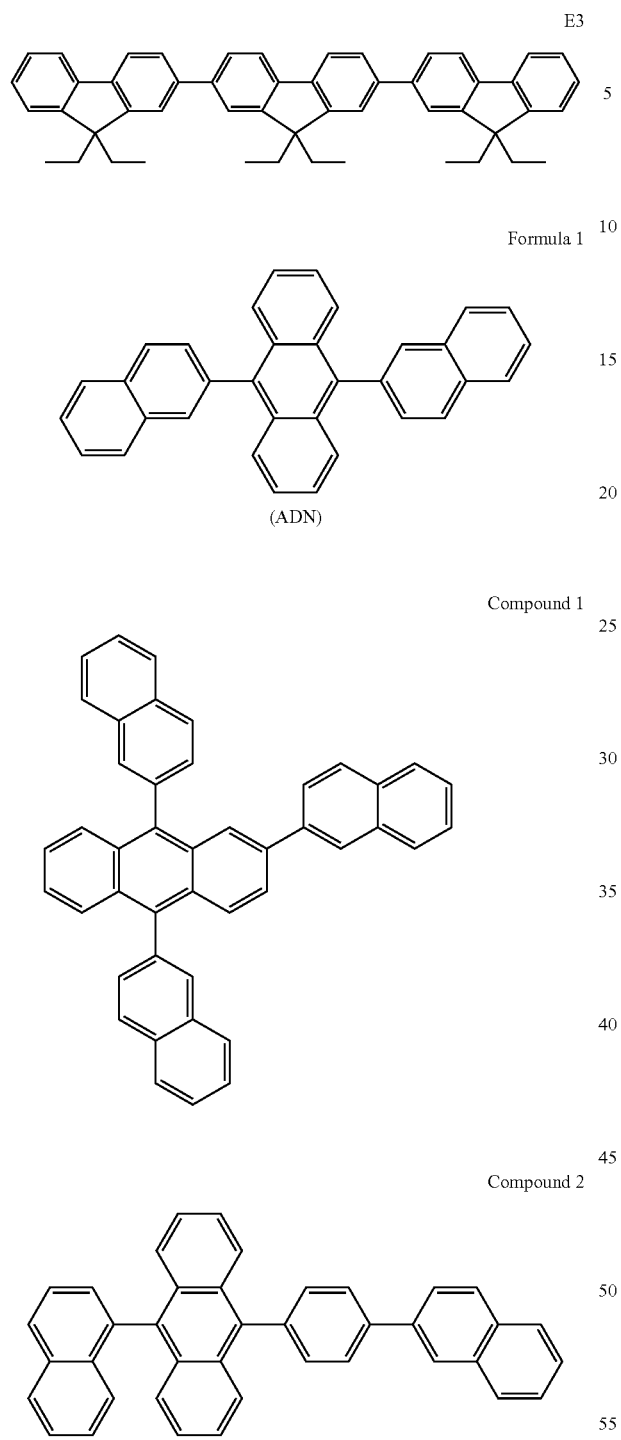

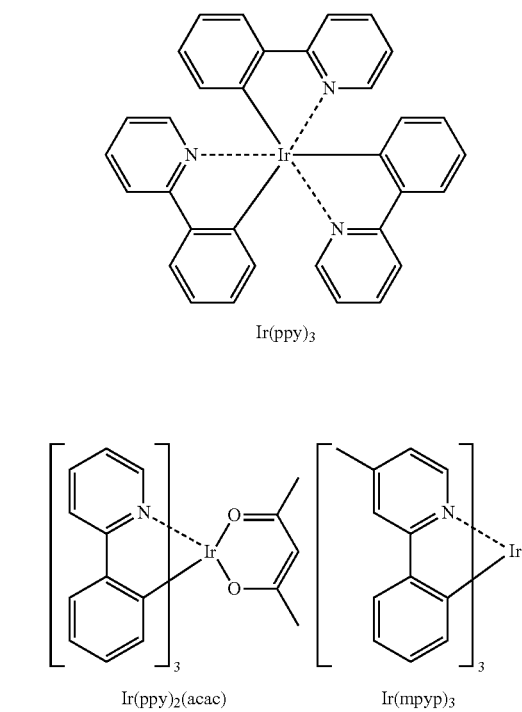

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

The dopant may be a phosphorescent or fluorescent emitter. Phosphorescent emitters are preferred due to their higher efficiency Examples of a red dopant are PtOEP, Ir(piq) 3, and Btp 21r(acac), but are not limited thereto. These compounds are phosphorescent emitters, however, fluorescent red dopants could also be used.

Compound 3

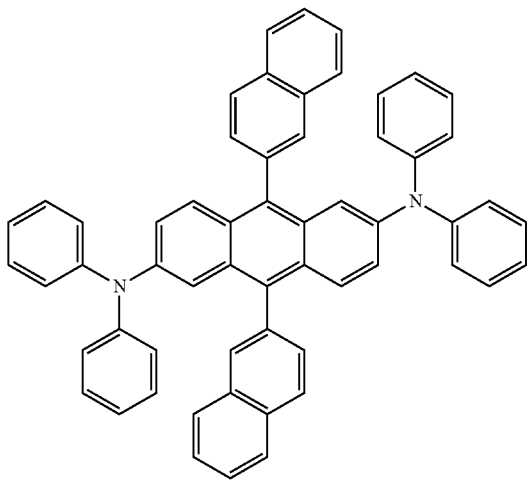

Compound 4

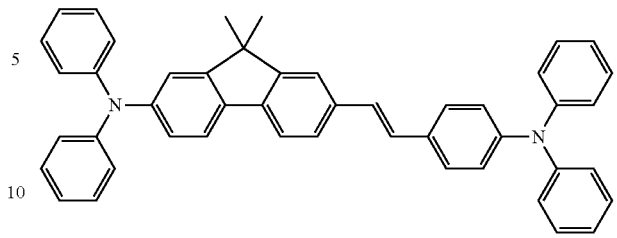

Examples of a phosphorescent blue dopant are F₂Irpic, (F₂ppy)₂Ir(tmd) and Ir(dfppz) 3, ter-fluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

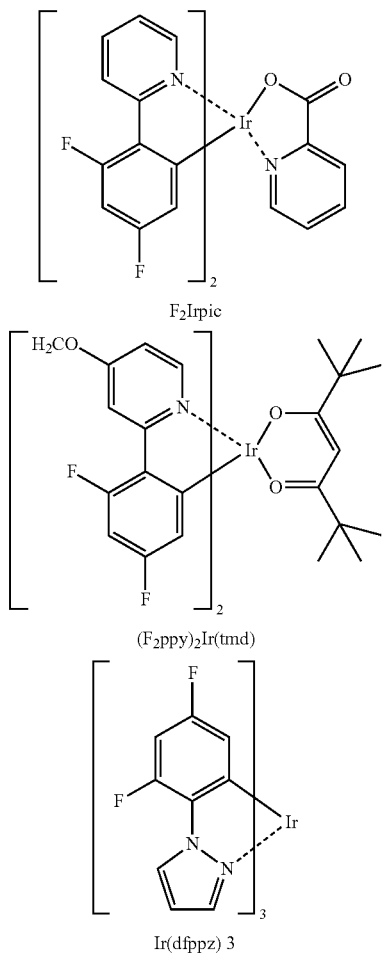

The amount of the dopant may be in the range of about 0.01 to about 50 parts by weight, based on 100 parts by weight of the host. The EML 150 may have a thickness of about 10 nm to about 100 nm, for example, about 20 nm to about 60 nm. When the thickness of the EML 150 is within this range, the EML 150 may have excellent light emission, without a substantial increase in driving voltage.

When the EML 150 comprises a phosphorescent dopant, a hole blocking layer (HBL) (not shown) may be formed on the EML 150, by using vacuum deposition, spin coating, slot-die coating, printing, casting, LB deposition, or the like, in order to prevent the diffusion of triplet excitons or holes into the ETL 160. When the HBL is formed using vacuum deposition or spin coating, the conditions for deposition and coating may be similar to those for the formation of the HIL 130. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

The ETL 160 may be formed on the EML 150 or on the HBL if the HBL is formed.

The ETL 160 has a stacked structure, preferably of two ETL-layers (161/162), so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL 160, the first layer 161 and the second layer 162 may have similar or identical energy levels. In general the matrix compound for the first electron layer (161) and second electron layer (162) can be identical or different.

Matrix compound for the first electron layer (161) and second electron layer (162) that can be suitable used are selected from the group comprising anthracene compounds, preferably 2-(4-(9,10-di(naphthalen-2-yl)anthracen-2-yl)phenyl)-1-phenyl-1H-benzo[d]imidazole and 1-(4-(10-([1,1'-biphenyl]-4-yl)anthracen-9-yl)phenyl)-2-ethyl-1H-benzo[d]imidazole.

Anthracene compounds that can be used as matrix compounds are disclosed in U.S. Pat. No. 6,878,469 B and incorporated by reference.

Other matrix compounds that can be used are diphenylphosphine oxide, preferably (3-(dibenzo[c,h]acridin-7-yl)phenyl)diphenylphosphine oxide, phenylbis(3-(pyren-1-yl)

phenyl)phosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyldi(pyren-1-yl)phosphine oxide.

Diphenylphosphine oxide compounds that can be used as matrix compounds are disclosed in EP 2395571 A1, WO2013079217 A1, EP 13187905, EP13199361 and JP2002063989 A1, incorporated by reference.

Other suitable matrix compounds that can be used are phenanthroline compounds, preferably selected from the group comprising 2,4,7,9-tetraphenyl-1,10-phenanthroline and 2,9-di(biphenyl-4-yl)-4,7-diphenyl-1,10-phenanthroline. Phenanthroline compounds that can be used as matrix compounds are disclosed in EP 1786050 A1 and incorporated by reference.

The matrix compound of the first electron layer (161) and/or second electron transport layer (162) may be a compound that efficiently transports electrons, such as an anthracene-based compound, diphenylphosphine oxide based compound, or a phenanthroline based compound, preferably a matrix compound mentioned in Table 2. For example, the matrix compound of the first electron layer and/or second electron transport layer may be selected from the group consisting of ADN and referred to as Formula 1, a compound represented by Formula 2, and a compound represented by Formula 3 below:

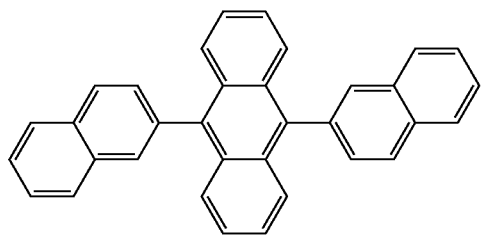

Formula 1 (ADN)

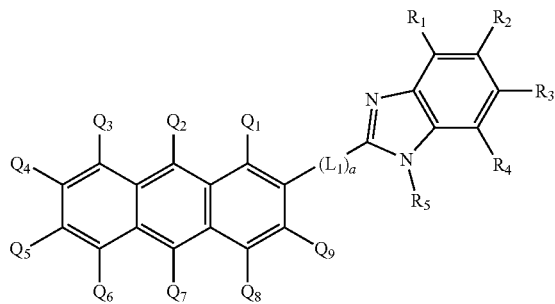

Formula 2

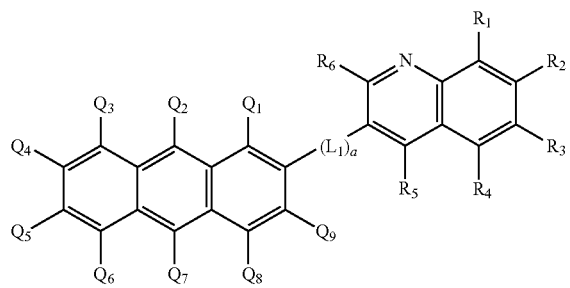

Formula 3

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, $L_1$ may be a phenylene group or a pyridinylene group. For example, "a" may be 1, 2, or 3.

The matrix compound may be further selected from Compound 6 or 7 below:

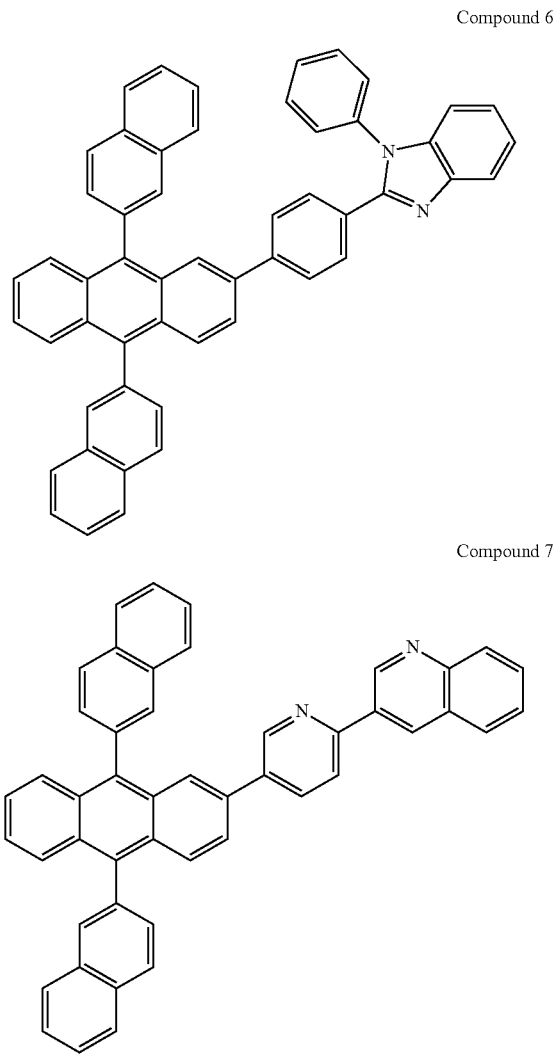

The first electron transport layer 161 comprises a lithium halide or a lithium organic complex; and the second electron transport layer 162 comprises an elemental metal selected from the group comprising lithium, magnesium, and/or ytterbium.

According to another aspect the first electron transport layer 161 comprises an elemental metal selected from the group comprising lithium, magnesium and/or ytterbium; and the second electron transport layer 162 comprises a lithium halide or a lithium organic complex.

According to another aspect the first electron transport layer 161 comprises a lithium halide or a lithium organic complex; and the second electron transport layer 162 comprises an elemental metal selected from the group comprising lithium, magnesium and/or ytterbium; and the third electron transport layer 163 comprises a lithium halide or a lithium organic complex that is the same or differs from the lithium halide or lithium organic complex of the first electron transport layer 161.

Suitable organic ligands to form a lithium organic complex that can be used for the first electron transport layer or the second electron transport layer are disclosed, and incorporated by reference, for example in WO 2013079676 A1, WO 2013079678 A1 and EP 2724388 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

The ETL layer stack thickness can be adjusted such that the light out coupling is maximized. Further ETL layer stack thickness can be adjusted for the desired color tuning, for example to achieve a deeper shade of blue, i.e. smaller CIE-y.

The thicknesses of the first electron transport layer 161, second electron transport layer 162 and/or third electron transport layer 163 may be the same or each independently in the range of about≥0.5 nm to about≤95 nm, preferably of about≥3 nm to about≤80 nm, further preferred of about≥5 nm to about≤60 nm, also preferred of about≥6 nm to about≤40 nm, in addition preferred about≥8 nm to about ≤20 nm and more preferred of about≥10 nm to about≤18 nm.

When the thicknesses of the first electron transport layer 161, second electron transport layer 162 and/or third electron transport layer 163 within this range, preferably of about≥10 nm to about≤18 nm, the electron transport layer stack 160 may effectively inject and transport electrons, without a substantial increase in driving voltage.

For blue emitting OLEDs, the thickness of the ETL layer stack is 10 to 50 nm, preferably 30 to 40 nm. For red and green emitting OLEDs, the thickness of ETLs is 20 to 100 nm, preferably 20 to100 nm and more preferably 30 to 80 nm. The thickness is selected so as to maximize efficiency of light emission.

The amount of the total lithium organic complexes in at least one electron transport layer (161) that is free of a metal salt may be in the range of about≥10 wt.-% to about≤70 wt.-%, preferably about≥20 wt.-% to about≤65 wt.-% and also preferred about≥30 wt.-% to about≤55 wt.-% and also preferred about≥35 wt.-% to about≤50 wt.-%, by weight of the first electron transport layer 161.

The amount of the lithium halide and lithium organic complex in the first electron transport layer 161 may be in the range of about≥10 wt.-% to about≤70 wt.-%, preferably about≥20 wt.-% to about≤65 wt.-% and also preferred about≥30 wt.-% to about≤55 wt.-% and also preferred about≥35 wt.-% to about≤50 wt.-%, by weight of the first electron transport layer 161.

The ETL 160 may be formed on the EML 150 by vacuum deposition, spin coating, slot-die coating, printing, casting, or the like. When the ETL 160 is formed by vacuum deposition or spin coating, the deposition and coating conditions may be similar to those for formation of the HIL 130. However, the deposition and coating conditions may vary, according to a compound that is used to form the ETL 160.

Using vacuum deposition, the first electron transport layer 161 of the ETL 160 may be formed using a first deposition source to deposit a matrix compound, and a second deposition source to deposit a lithium halide or first lithium organic complex and a third deposition source to deposit a second lithium organic complex. The first deposition source, second deposition source and third deposition source are positioned relative to one another, such that a mixed deposition region of the first electron transport layer 161 is formed directly on the EML 150.

The second electron transport layer 162 of the ETL 160 may be formed using a first or a third deposition source, for example if the matrix compound is different to the ETL 161.

In case the second electron transport layer 162 of the ETL 160 may comprise a different matrix compound than ETL1 a fourth deposition source is used to deposit the matrix compound. In case a lithium halide and a lithium organic complex or two different lithium organic complexes are deposit for forming the ETL 2 additional deposition sources are used. If compounds used to form the first ETL1 and second ETL 2 are identical, than the same deposition sources can be used.

The deposition sources are positioned relative to one another, such that a mixed deposition region of the second electron transport layer 162 is formed directly on the first electron transport layer 161.

The stacking process is more simply and quickly performed, as compared to prior methods. In particular, since a plurality of ETL layers may be almost simultaneously deposited in a single chamber, the chamber may not be required to be exhausted after the formation of each layer.

The EIL 180, which facilitates injection of electrons from the cathode, may be formed on the ETL 160, preferably directly on the second electron transport layer 162. Examples of materials for forming the EIL 180 include LiF, NaCl, CsF, Li2O, BaO, Ca, Ba, Yb, Mg which are known in the art. Deposition and coating conditions for forming the EIL 180 are similar to those for formation of the HIL 130, although the deposition and coating conditions may vary, according to a material that is used to form the EIL 180.

The thickness of the EIL 180 may be in the range of about 0.1 nm to 10 nm, for example, in the range of 0.5 nm to 9 nm. When the thickness of the EIL 180 is within this range, the EIL 180 may have satisfactory electron-injecting properties, without a substantial increase in driving voltage.

The second cathode electrode 190 is formed on the EIL 180 if present. The second cathode electrode 190 may be a cathode, which is an electron-injecting electrode. The second electrode 190 may be formed of a metal, an alloy, an electrically conductive compound, or a mixture thereof. The second electrode 190 may have a low work function. For example, the second electrode 190 may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the second electrode 190 may be formed of a transparent conductive material, such as ITO or IZO.

The thickness of the cathode electrode 190 may be in the range of about 5 nm to 1000 nm, for example, in the range of 10 nm to 100 nm. When the cathode electrode 190 is in the range of 5 nm to 50 nm, the electrode will transparent even if a metal or metal alloy is used.

Since the layers of the ETL 160 have similar or identical energy levels, the injection and transport of the electrons may be controlled, and the holes may be efficiently blocked. Thus, the OLED 100 may have long lifetime.

Figure 7:
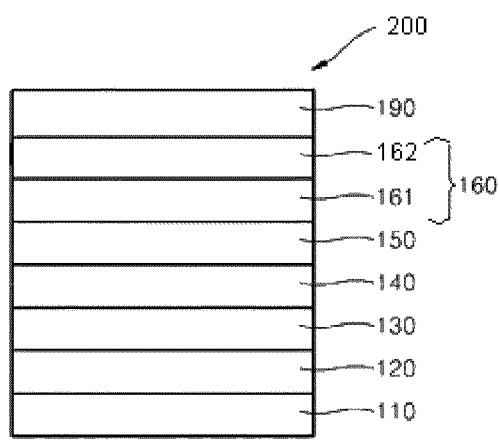
FIG. 7 is a schematic sectional view of an OLED, according to an exemplary embodiment of the present invention with an emission layer and two electron transport layers and having no electron injection layer (EIL).
Figure 8:
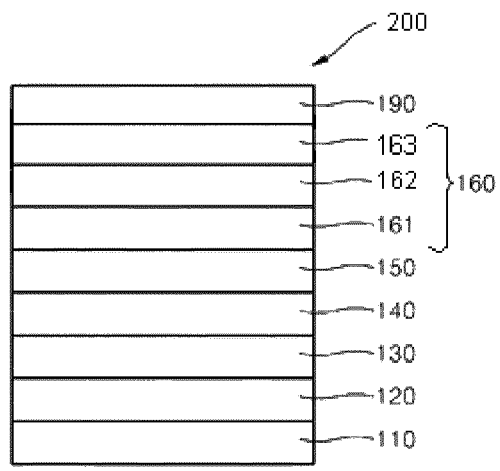
FIG. 8 is a schematic sectional view of an OLED, according to an exemplary embodiment of the present invention with three electron transport layers and having no electron injection layer (EIL).

FIG. 7 and FIG. 8 is a schematic sectional view of an OLED 200, according to another exemplary embodiment of the present invention. The OLED 200 of FIGS. 7 and 8 has no electron injection layer (EIL) 180.

Referring to FIGS. 7 and 8 the OLED 200 includes a substrate 110, a first electrode 120, a HIL 130, a HTL 140, an EML 150, an ETL 160, and a second electrode 190. The ETL stack 160 of FIG. 7 includes a first ETL layer 161 and a second ETL layer 162. The ETL stack 160 of FIG. 8 includes a first ETL layer 161, a second ETL layer 162 and a third ETL layer 163.

The electron transport layer stack 160 of FIG. 7 comprises at least two electron transport layers 161 and 162, wherein a first electron transport layer 161 and a second electron transport layer 162 comprises at least one matrix compound and in addition,
the first electron transport layer comprises two lithium organic complexes, and
the second electron transport layer comprises two lithium organic complexes; wherein the first electron transport layer is arranged closest to an anode and the second electron transport layer is arranged closest to a cathode.

The electron transport layer stack 160 of FIG. 8 comprises at least three electron transport layers 161, 162 and 163, wherein a first electron transport layer 161, a second electron transport layer 162 and a third electron transport layer 163 comprises at least one matrix compound and in addition,
the first electron transport layer 161 comprises a lithium halide and lithium organic complex,
the third electron transport layer 163 comprises two lithium organic complexes, and
the second electron transport layer 162 is free of lithium halide and lithium organic complex; wherein
the first electron transport layer 161 is arranged closest to an anode and the third electron transport layer 163 is arranged closest to a cathode.

The layers of the ETL 161 and 162 or of the ETL 161 and 163 have similar or identical energy level. The OLED 200 have an improved lifetime (LT). The substrate 110, the first electrode 120, the hole injection layer 130, the hole transport layer 140, the emission layer 150, and the electron transport layer 161 and 162 of the OLED 200 of FIG. 7 and FIG. 8 are similar to corresponding elements described with reference to FIGS. 5 and 6, respectively. Even though the structure of the OLED 200 and the method of manufacturing the OLED 200 are described with reference to FIGS. 5 and 6, other methods known in the art can be used. For example, the ETL stack 160 may include three or more ETL layers but two ETL layers of ETL 161 and 162 may be preferred and one ETL layer only can be most preferred.

In the description above the method of manufacture an OLED of the present invention is started with a substrate 110 onto which a first anode electrode 120 is formed, on the first anode electrode 120 an emission layer 150 is formed. An electron transport layer 161 or electron transport layer stack 160 is formed on the emission layer 150, wherein in case of an electron transport layer stack 160 the first electron transport layer 161 is formed on the emission layer 150 and the second electron transport layer 162 is formed directly on the first electron transport layer 161, on the electron transport layer stack 160, in this case on the second electron transport layer 162, a cathode electrode 190 is formed, optional a hole injection layer 130, and a hole transport layer 140, are formed between the first anode electrode 120 and the electron transport layer stack 160, an optional hole blocking layer is formed between the emission layer and the ETL layer stack, and optionally an electron injection layer 180 is formed between the electron transport layer 160 and the second cathode electrode 190.

However, the OLED of the present invention can be manufactured also the other way around, starting with the second cathode electrode 190 onto which optionally an electron injection layer 180 is formed. On the second cathode electrode 190 or on the electron injection layer 180, if present, the electron transport layer 161 or electron transport layer stack (160) is formed, whereby directly on the second electron transport layer 162 the first electron transport layer 161 is formed, and so on.

In case of a three layer electron transport layer stack 160, the second electron layer 162 is formed on the first electron layer 161 and the third electron layer 163 is formed on the second electron layer 162. Then a cathode electrode 190 is formed, optional a hole injection layer 130, and a hole transport layer 140, are formed between the first anode electrode 120 and the electron transport layer stack 160, an optional hole blocking layer is formed between the emission layer and the ETL layer stack, and optionally an electron injection layer 180 is formed between the electron transport layer 160 and the second cathode electrode 190.

While not shown in FIGS. 5 to 8, a sealing layer may further be formed on the second electrodes 190, in order to seal the OLEDs 100, 200. In addition, various other modifications may be applied thereto.

Hereinafter, one or more exemplary aspects will be described in detail with, reference to the following examples. However, these examples are not intended to limit the purpose and scope of the one or more exemplary aspects.

EXAMPLES

General procedure

For bottom emission devices, a 15Ω/cm² glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

For top emission devices, the anode electrode was formed from 100 nm silver on glass which was prepared by the same methods as described above.

Then, 92 wt.-% of N4, N4"-di(naphthalen-1-yl)-N4, N4"-diphenyl-[1,1':4',1"-terphenyl]-4,4"-diamine and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then N4, N4"-di(naphthalen-1-yl)-N4, N4"-diphenyl-[1,1':4',1"-terphenyl]-4,4"-diamine was vacuum deposited on the HIL, to form a HTL having a thickness of 130 nm in top emission devices and 120 nm in bottom emission devices. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then the ETL-layer stack is formed by depositing the first electron transport layer (ETL 1) including a matrix compound according to Example 1 to Example 11 and comparative example 1 by deposing the matrix compound from a first deposition source and the lithium organic complex, lithium halide of from a second and third deposition source directly on the EML or the two lithium organic complexes from a second and third deposition source.

Then optional the second electron transport layer (ETL2) including a matrix compound is formed by deposing the matrix compound from a first deposition source or if the matrix material is different to the matrix material of the first electron transport layer (ETL1), from a different deposition source.

For the comparative example 1 only one electron transport layer ETL1 is formed. The wt.-% of the lithium organic complex for the ETL1 can be taken from Table 4 and 5, whereby the wt.-% amount of the matrix compound is added to 100 wt.-%, respectively. That means, that the matrix compound of ETL1 are added in a wt.-% amount such that the given wt.-% of the two lithium organic complexes for the ETL1 and the matrix compound of the ETL1 are in total 100 wt.-%, based on the weight of the ETL1. Further, the thickness d (in nm) of the ETL1 can be taken from Table 4 and 5. The cathode was evaporated at ultra-high vacuum of $10^{-7}$ bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For top emission devices, the cathode electrode was formed from 13 nm magnesium (90 vol.-%) and silver (10 vol.-%) alloy, followed by 60 nm N4,N4"-di(naphthalen-1-yl)-N4,N4"-diphenyl-[1,1':4',1"-terphenyl]-4,4"-diamine. For bottom emission devices, the cathode electrode was formed from 100 nm aluminum.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 15 mA/cm², a calibrated spectrometer CAS140 from Instrument Systems is used for measurement of CIE coordinates and brightness in Candela. Lifetime LT of the device is measured at ambient conditions (20° C.) and 15 mA/cm², using a Keithley 2400 sourcemeter, and recorded in hours. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm2.

In top emission devices, the emission is forward directed, non-Lambertian and also highly dependent on the mircocavity. Therefore, the efficiency EQE will be higher compared to bottom emission devices. To determine the efficiency EQE in % the light output of the device is measured using a calibrated photodiode at 10 mA/cm².

Technical Effect of the Invention

Top Emission Devices a) Lifetime and efficiency improvement with one electron transport layer (ETL1)

In Table 4 results are shown for top emission devices with one electron transport layer (ETL1) containing one matrix compound and two lithium organic complexes AD1 and AD2. An external quantum efficiency (EQE) and lifetime improvement is observed compared to the emission device with one lithium organic complex only—Table 4.

TABLE 4

External quantum efficiency (EQE) and lifetime of top emission OLEDs with a single triple mixed ETL

|  | ETL1 (ETM:AD1:AD2) | d (ETL)/ nm | wt %*[1] ETM:AD1:AD2 | V at 15 mA/cm$^2$/V | EQE*[2]/% | CIE-y | LT/h |
|---|---|---|---|---|---|---|---|
| Comp. Example 1 | MX-2:LiQ | 36 | 50:50:00 | 4.63 | 9.6 | 0.047 | 140 |
| Example 1 | MX-2:Li-2:Li-1 | 36 | 65:25:10 | 4.30 | 13.2 | 0.050 | 25 |
| Example 2 | MX-2:LiQ:Li-1 | 36 | 65:25:10 | 4.32 | 12.6 | 0.049 | 39 |
| Example 3 | MX-2:Li-3:Li-2 | 36 | 50:25:25 | 4.89 | 10.2 | 0.050 | 140 |
| Example 4 | MX-3:LiQ:Li-1 | 37 | 65:25:10 | 4.16 | 12.5 | 0.069 | 21 |
| Example 5 | MX-11:LiQ:Li-1 | 36 | 65:25:10 | 5.02 | 10.5 | 0.066 | 32 |
| Example 6 | MX-11:Li-2:Li-1 | 36 | 65:25:10 | 5.26 | 11.3 | 0.067 | 22 |

*[1]= the wt.-% of the matrix compound (ETM) and the wt.-% of the lithium organic complexes (AD1 and AD2) are in total 100 wt.-% based on weight of the ETL1
*[2]= detecting the light output efficiency with a calibrated photo diode In the Table 4 above device data for a single ETL device with one lithium organic complex compared to a device with a single ETL containing two lithium organic complexes is shown. As can be seen, the efficiency are improved for devices having a single ETL containing two lithium organic complexes compared to a device having a single ETL with just one lithium organic complex (Comparative example 1).

In Example 2 and 4, and 5 and 6, respectively, the effect of a second lithium organic complex, lithium borate (Li-1), is compared to comparative example 1, containing just one lithium organic complex, lithium quinolate LiQ. The efficiency is increased compared to comparative example 1, thereby demonstrating an advantageous effect of a second lithium organic complex, in particular of lithium borate.

In Example 1 and 6, the effect of a second lithium compound which is not LiQ is compared to Example 2 and 5 containing LiQ and lithium borate Li-1. In Example 1 and 6, lithium phosphoryl aryl complex (Li-2), is used instead of LiQ. As can be seen in Table 4, the efficiency is improved even further, from 12.6 to 13.2% EQE for phosphine oxide matrix, and from 10.5 to 11.3% EQE for phenanthroline matrix. These results clearly show a technical benefit of selecting the first and second lithium compound from lithium borate and lithium phosphoryl aryl complex, respectively.

An increase in efficiency can be obtained for matrix compounds with various LUMO levels and functional groups. In Example 2 and 4, phosphine oxide matrix compounds with a LUMO level ranging from −2.64 eV (MX-2) to −2.36 eV (MX-3) are compared. As can be seen in Table 4, the efficiency improvement is independent of the LUMO level of the phosphine oxide matrix.

In Example 1 and 6, two different materials classes of matrix compounds are compared, a phosphine oxide matrix compound (MX-2) and a phenanthroline matrix compound (MX-11). In both cases, an efficiency improvement is observed compared to the comparative example 1. However, the efficiency improvement is more pronounced for the phosphine oxide matrix compound.

The lifetime and efficiency is also improved when comparing the single ETL device of Example 3 with the comparative example 1.

Bottom Emission Devices a) Lifetime and efficiency improvement with one electron transport layer (ETL1)

In Table 5 results are shown for bottom emission devices with one electron transport layer (ETL1) containing one matrix compound and two lithium organic complexes AD1 and AD2.

TABLE 5

External quantum efficiency (EQE) and lifetime of bottom emission OLEDs with a single triple mixed ETL

|  | ETL1 (ETM:AD1:AD2) | d (ETL)/ nm | wt %*[1] ETM:AD1:AD2 | V at 15 mA/cm$^2$/V | EQE*[2]/% | CIE-y | LT/h |
|---|---|---|---|---|---|---|---|
| Example 7 | MX-2:LiQ:Li-3 | 37 | 65:25:10 | 4.8 | 5.6 | 0.098 | 200 |
| Example 8 | MX-12:LiQ:Li-1 | 36 | 65:25:10 | 7.6 | 6.3 | 0.096 | 7 |
| Example 9 | MX-2:LiQ:Li-1 | 36 | 65:25:10 | 4.4 | 8 | 0.097 | 45 |
| Example 10 | MX-12:Li-2:Li-1 | 36 | 65:25:10 | 6.8 | 7.8 | 0.093 | 6 |
| Example 11 | MX-2:Li-2:Li-1 | 36 | 65:25:10 | 4.4 | 8.6 | 0.095 | 27 |

*[1]= the wt.-% of the matrix compound (ETM) and the wt.-% of the lithium organic complexes (AD1 and AD2) are in total 100 wt.-% based on weight of the ETL1
*[2]= detecting the light output efficiency with a calibrated photo diode In the Table 5 above a device data is shown for a single ETL device with two lithium organic complexes, AD1 and AD2.

In Example 7, phosphine oxide matrix compound (MX-2) is doped with a first lithium organic complex (LiQ) and a second lithium organic complex (Li-3). The structures of LiQ and Li-3 are shown in Table 1. Both lithium organic complexes are lithium phenolates whereby the phenolate ring is substituted further. As can be seen in Table 5, the efficiency is 5.6% EQE and the lifetime is 200 hours.

In Example 8, an anthracene matrix compound (MX-12) is doped with a first lithium organic complex containing a nitrogen heterocyclic ligand bearing a hydroxyl group and a second lithium organic complex which does not contain a heterocyclic ligand bearing a hydroxyl group. In Example 8, the first lithium organic complex is LiQ and the second lithium organic complex is lithium borate Li-1. The efficiency is 6.3% EQE and the lifetime is 7 hours.

In Example 9, a phosphine oxide matrix compound (MX-2) is doped with a first lithium organic complex containing a nitrogen heterocyclic ligand bearing a hydroxyl group and a second lithium organic complex which does not contain a heterocyclic ligand bearing a hydroxyl group. In Example 9, the first lithium organic complex is LiQ and the second lithium organic complex is borate Li-1. The efficiency is 8% EQE and the lifetime is 45 hours. Efficiency and lifetime are significantly improved compared to Example 8, thereby demonstrating the beneficial effect of a phosphine oxide matrix compound compared to an anthracene matric compound.

In Example 10 and 11, two lithium organic complexes are used which do not containing a nitrogen heterocyclic ligand bearing a hydroxyl group. The first lithium organic complex is lithium phosphoryl aryl complex Li-2 and the second lithium organic complex is borate Li-1. Two matrix compounds are compared, an anthracene matrix compound (MX-12) in Example 10, and a phosphine oxide matrix compound (MX-2) in Example 11, respectively. In both examples, the efficiency EQE is 7.8 and 8.6% EQE. The efficiency is significantly improved over Examples 8 and 9, and thereby it is shown that there is an additive beneficial effect of using lithium organic complexes which do not contain a nitrogen heterocyclic ligand bearing a hydroxyl group. The beneficial effect of two lithium organic complexes, in particular of two lithium organic complexes which are based on borate and/or phosphoryl aryl ligand is apparent even for different matrix compound classes, for example anthracene matrix compound and phosphine oxide matrix compounds. The lifetime in Examples 10 is 6 hours while the lifetime in Example 11 is 27 hours.

In summary, a significant improvement in external quantum efficiency EQE is achieved for matrix compounds doped with at least on lithium organic complex selected from a lithium borate complex or a lithium phosphoryl aryl complex. Additionally, a significant increase in lifetime is observed for matrix compounds comprising a phosphine oxide compared to anthracene-based matrix compounds.

The OLED according to the invention comprising a single ETL, a double ETL as well as the triple ETL could also be employed for other emission colors, for example green, red, and white-light emitting devices.

Another aspect is directed to an organic light-emitting diode (OLED) comprising more than one emission layer (EML) 150, for example two, three or four emission layers may be present. An organic light-emitting diode (OLED) comprising more than one emission layer is also described as a tandem OLED or stacked OLED.

Another aspect is directed to a device comprising at least one organic light-emitting diode (OLED). A device comprising organic light-emitting diodes is for example a display or a lighting panel.

From the foregoing detailed description and examples, it will be evident that modifications and variations can be made to the compositions and methods of the invention without departing from the spirit and scope of the invention. Therefore, it is intended that all modifications and/or combinations of embodiments made to the invention without departing from the spirit and scope of the invention come within the scope of the appended claims.

The invention claimed is:

1. An organic light-emitting diode (OLED) comprising an emission layer and at least one electron transport layer, wherein the at least one electron transport layer comprises at least one matrix compound and at least two lithium compounds, and wherein at least one lithium compound is a lithium organic complex, which is selected from a lithium borate complex or a lithium phosphoryl aryl complex, and at least one lithium compound is a lithium halide selected from LiF, LiCl, LiBr, or LiI.

2. The OLED according to claim 1, wherein:
the lithium borate complex is of Formula IV:

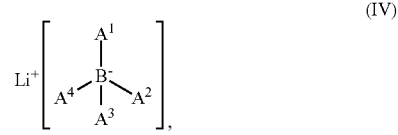

wherein each of $A^1$, $A^2$, $A^3$, and $A^4$ is independently selected from substituted or unsubstituted $C_6$-$C_{20}$ aryl or substituted or unsubstituted $C_2$-$C_{20}$ heteroaryl, wherein $A^1$, $A^2$, $A^3$, and/or $A^4$ of Formula (IV) are not a phenolate group; and/or the lithium phosphoryl aryl complex is of Formula V:

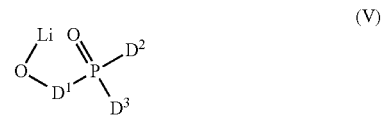

wherein $D^1$ is a unsubstituted or substituted $C_6$-$C_{20}$ arylene and each of $D^2$ to $D^3$ is independently selected from a unsubstituted or substituted $C_6$-$C_{20}$ aryl; and/or wherein $D^1$ is a $C_6$-$C_{30}$ arylene or $C_2$-$C_{30}$ heteroarylene comprising at least one atom selected from O, S, or N in an aromatic ring; and each of $D^2$ and $D^3$ is independently selected from a $C_6$-$C_{30}$ aryl or $C_2$-$C_{30}$ heteroaryl comprising at least one atom selected from O, S, or N in an aromatic ring and wherein either i) $D^1$ is $C_2$-$C_{30}$ heteroarylene comprising at least one atom selected from O, S, or N in an aromatic ring, and/or ii) at least one of $D^2$ and $D^3$ is a $C_2$-$C_{30}$ heteroaryl comprising at least one atom selected from O, S, or N in an aromatic ring.

3. The OLED according to claim 2, wherein the lithium phosphoryl aryl complex is a lithium 2-(diphenylphosphoryl) phenolate.

4. The OLED according to claim 2, wherein the lithium borate complex is a lithium tetra(1H-pyrazol-1-yl)borate.

5. The OLED according to claim 1, wherein the matrix compound is selected from:
an anthracene based compound or a heteroaryl substituted anthracene based compound;
a phosphine oxide based compound; or
a substituted phenanthroline compound.

6. The OLED according to claim 1, wherein the at least one electron transport layer or at least two electron transport layers comprise:
about <90 wt.-% to about >30 wt.-% of the at least one matrix compound; and
about >10 wt.-% to about <70 wt.-% of the at least two lithium compounds;
wherein the weight percent is based on the total weight of the corresponding electron transport layer.

7. The OLED according to claim 1, wherein the at least one electron transport layer comprises a third lithium compound selected from a lithium quinolate or a lithium phenolate.

8. The OLED according to claim 1, wherein the at least one electron transport layer or at least two electron transport layers comprise:
- about <80 wt.-% to about >35 wt.-% of the at least one matrix compound; and
- about >20 wt.-% to about <65 wt.-% of the at least two lithium compounds;
- wherein the weight percent is based on the total weight of the corresponding electron transport layer.

9. The OLED according to claim 1, wherein the OLED comprises one electron transport layer and at least one electron injection layer; or a transport layer stack having two to four electron transport layers, whereby at least one electron transport layer comprises the at least one matrix compound and the at least two lithium compounds.

10. The OLED according to claim 1, wherein an at least second electron transport layer is arranged directly on the at least first electron transport layer and/or an at least third electron transport layer is arranged directly on the at least second electron transport layer so that the second electron transport layer is sandwiched between the first electron transport layer and the third electron transport layer.

11. The OLED according to claim 1 comprising: a substrate; a first anode electrode that is arranged on the substrate; a second cathode electrode that is arranged on the at least first anode electrode; and the at least one electron transport layer or an electron transport layer stack comprising the at least one electron transport layer, that is arranged between the at least first anode electrode and the at least second cathode electrode.

12. The OLED according to claim 11, further comprising an electron injection layer arranged between the electron transport layer stack and the at least second cathode electrode.

13. The OLED according to claim 1, further comprising at least one layer selected from the group consisting of a hole injection layer, a hole transport layer and a hole blocking layer, arranged between the at least first anode electrode and the electron transport layer stack.

14. The OLED according to claim 1, wherein the lithium borate complex is a lithium tetra(1H-pyrazol-1-yl)borate.

15. A method of manufacturing an organic light-emitting diode according to claim 1, the method using:
- at least three deposition sources; and/or
- deposition via vacuum thermal evaporation; and/or
- deposition via solution processing.

16. A method of manufacturing an organic light-emitting diode according to claim 15, the method using:
- a first or a first and a fourth deposition source to release the matrix compound, and
- a second deposition source to release a first lithium compound of lithium halide or lithium organic complex, and
- a third deposition source to release a second lithium compound of lithium halide or lithium organic complex; and the method comprising the steps of forming the electron transport layer or the electron transport layer stack; whereby
- a first electron transport layer is formed by releasing the matrix compound from at least one deposition source and a first lithium halide or lithium organic complex, from a different deposition source and a second lithium halide or lithium organic complex, from a different deposition source;
- optional onto the first electron transport layer a second electron transport layer is formed by releasing the matrix compound from at least one deposition source and optional the first and second lithium compound from different deposition source;
- optional onto the second electron transport layer a third electron transport layer is formed by releasing the matrix compound from at least one deposition source and optional the first and second lithium compound from different deposition source.

17. The method of claim 15, comprising the steps, wherein
- on a substrate a first anode electrode is formed,
- on the first anode electrode an emission layer is formed,
- on the emission layer at least a first electron transport layer is formed, optional a second electron transport layer is formed directly on the first electron transport layer or optional in case of a third electron transport layer, the third electron transport layer is formed directly on the second electron transport layer,
- on the electron transport layer or the electron transport layer stack a second cathode electrode is formed,
- optional a hole injection layer, a hole transport layer, an emission layer, and a hole blocking layer, are formed between the at least first anode electrode and the electron transport layer or electron transport layer stack,
- optional an electron injection layer is formed between the electron transport layer or electron transport layer stack, and the at least second cathode electrode.

18. A device comprising at least one organic light-emitting diode of claim 1.

19. An organic light-emitting diode (OLED) comprising an emission layer and at least one electron transport layer, wherein the at least one electron transport layer comprises at least one matrix compound and at least two lithium compounds,
- wherein (i) at least one of the at least two lithium compounds is a lithium organic complex, which is selected from a lithium phenolate, a lithium pyridinolate, or a lithium Schiff base, or (ii) one of the at least two lithium compounds is a lithium borate or a lithium pyridinolate, and one of the at least two lithium compounds is a lithium quinolate, a lithium borate, a lithium phenolate, a lithium pyridinolate or a lithium Schiff base; and
- wherein (a) the lithium phenolate is a lithium 2-(1-phenyl-1H-benzo imidazol-2-yl)phenolate, (b) the lithium pyridinolate is a lithium 2-(diphenylphosphoryl)pyridin-3-olate, and/or (c) the lithium Schiff base has the structure 100, 101, 102 or 103—

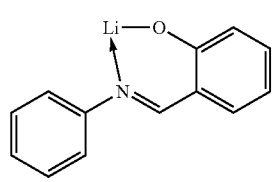

100

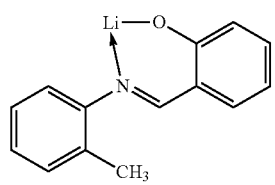

101

-continued

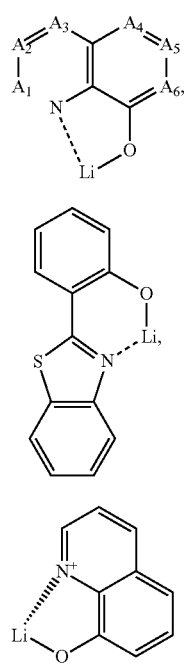

20. The OLED according to claim 19, wherein the lithium quinolate has the formula I, II or III:

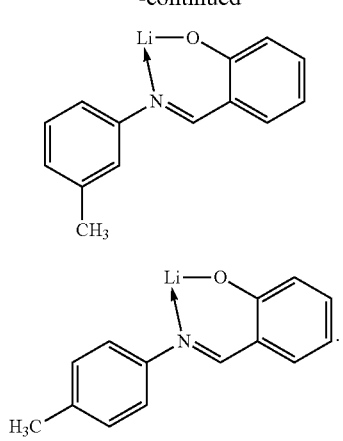

wherein
A 1 to A 6 are same or independently selected from CH, CR, N, or O;

R is same or independently selected from hydrogen, halogen, alkyl or aryl or heteroaryl with 1 to 20 carbon atoms.

21. The OLED according to claim 20, wherein A 1 to A 6 are CH.

22. The OLED according to claim 19, wherein the lithium phenolate is a lithium 2-(pyridin-2-yl)phenolate, a lithium 2-(diphenylphosphoryl)phenolate, a lithium imidazol phenolate, or a lithium 2-(pyridin-2-yl)phenolate.

23. The OLED according to claim 19, wherein the OLED comprises the lithium 2-(diphenylphosphoryl)pyridin-3-olate.

24. The OLED according to claim 19, wherein the OLED comprises the lithium Schiff base having the structure 100, 101, 102 or 103:

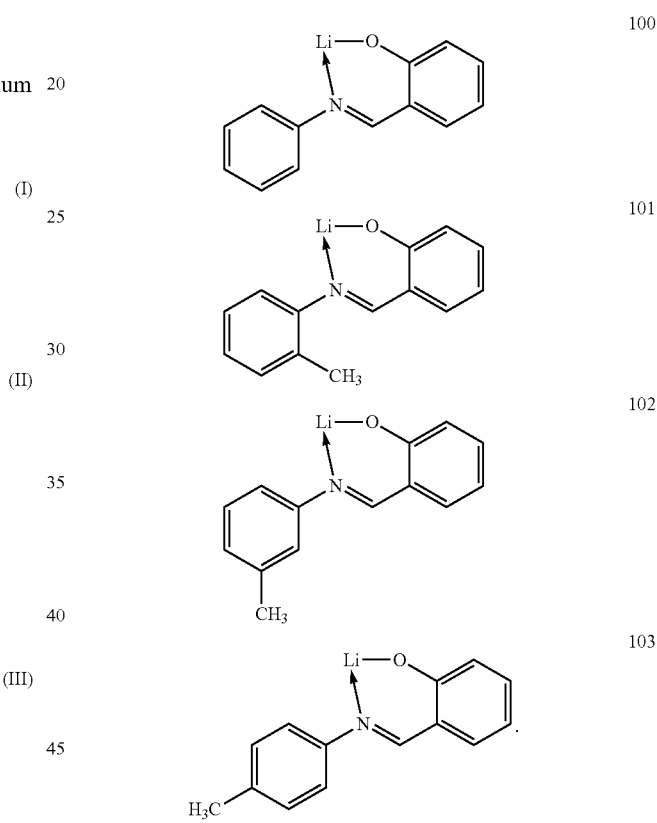

25. The OLED according to claim 19, wherein the OLED comprises the lithium 2-(1-phenyl-1H-benzoimidazol-2-yl) phenolate.

* * * * *